(12) United States Patent
Machita et al.

(10) Patent No.: US 7,881,023 B2
(45) Date of Patent: Feb. 1, 2011

(54) MAGNETORESISTIVE DEVICE OF THE CPP TYPE, AND MAGNETIC DISK SYSTEM

(75) Inventors: Takahiko Machita, Tokyo (JP); Koji Shimazawa, Tokyo (JP); Daisuke Miyauchi, Tokyo (JP); Tsutomu Chou, Tokyo (JP)

(73) Assignee: TDK Corporation, Tokyo (JP)

( * ) Notice: Subject to any disclaimer, the term of this patent is extended or adjusted under 35 U.S.C. 154(b) by 564 days.

(21) Appl. No.: 12/019,202

(22) Filed: Jan. 24, 2008

(65) Prior Publication Data

US 2009/0190272 A1     Jul. 30, 2009

(51) Int. Cl.
*G11B 5/33* (2006.01)
*G11B 5/127* (2006.01)

(52) U.S. Cl. .................................. 360/324.12
(58) Field of Classification Search ................. 360/319, 360/322, 324.1, 324.12, 324.2
See application file for complete search history.

(56) References Cited

U.S. PATENT DOCUMENTS

| | | | |
|---|---|---|---|
| 5,576,914 A | 11/1996 | Rottmayer et al. | |
| 6,205,008 B1* | 3/2001 | Gijs et al. | 360/324 |
| 6,563,679 B1* | 5/2003 | Li et al. | 360/324 |
| 6,724,583 B2 | 4/2004 | Seigler et al. | |
| 6,906,898 B2* | 6/2005 | Kawato | 360/314 |
| 7,036,208 B2* | 5/2006 | Ho et al. | 29/603.13 |
| 7,505,234 B2* | 3/2009 | Fukuzawa et al. | 360/324.1 |
| 7,710,690 B2* | 5/2010 | Nakamura et al. | 360/324.1 |
| 2002/0135954 A1* | 9/2002 | Yoshikawa et al. | 360/324.12 |
| 2008/0186640 A1* | 8/2008 | Matsubara et al. | 360/324.12 |

FOREIGN PATENT DOCUMENTS

| | | |
|---|---|---|
| JP | 2002-123912 | 4/2002 |
| JP | 2002-175611 | 6/2002 |
| JP | 2004-319709 | 11/2004 |

OTHER PUBLICATIONS

U.S. Appl. No. 12/255,105, filed Oct. 21, 2008, Chou, et al.
U.S. Appl. No. 11/946,358, filed Nov. 28, 2007, Shimazawa, et al.

(Continued)

*Primary Examiner*—Angel A. Castro
(74) *Attorney, Agent, or Firm*—Oblon, Spivak, McClelland, Maier & Neustadt, L.L.P.

(57) ABSTRACT

The invention provides a magnetoresistive device with the CPP (current perpendicular to plane) structure, comprising a magnetoresistive unit, and a first shield layer and a second shield layer located and formed such that the magnetoresistive unit is sandwiched between them, with a sense current applied in a stacking direction, wherein the magnetoresistive unit comprises a nonmagnetic intermediate layer, and a first ferromagnetic layer and a second ferromagnetic layer stacked and formed such that the nonmagnetic intermediate layer is interposed between them, wherein the first shield layer, and the second shield layer is controlled by magnetization direction control means in terms of magnetization direction, and the first ferromagnetic layer, and the second ferromagnetic layer receives action such that there is an antiparallel magnetization state created, in which mutual magnetizations are in opposite directions, under the influences of magnetic actions of the first shield layer and the second shield layer.

17 Claims, 16 Drawing Sheets

OTHER PUBLICATIONS

U.S. Appl. No. 12/019,205, filed Jan. 24, 2008, Machita, et al.
U.S. Appl. No. 12/014,575, filed Jan. 15, 2008, Chou, et al.
U.S. Appl. No. 12/022,538, filed Jan. 30, 2008, Chou, et al.
U.S. Appl. No. 12/028,243, filed Feb. 8, 2008, Shimazawa, et al.

* cited by examiner

MAGNETORESISTIVE DEVICE OF THE CPP TYPE, AND MAGNETIC DISK SYSTEM

BACKGROUND OF THE INVENTION

1. Field of the Invention

The present invention relates to a magnetoresistive device adapted to read the magnetic field intensity of magnetic recording media or the like as signals, and a thin-film magnetic head comprising that magnetoresistive device as well as a head gimbal assembly and a magnetic disk system, one each including that thin-film magnetic head.

2. Explanation of the Prior Art

In recent years, with an increase in the recording density of hard disks (HDDs), there have been growing demands for improvements in the performance of thin-film magnetic heads. For the thin-film magnetic head, a composite type thin-film magnetic head has been widely used, which has a structure wherein a reproducing head having a read-only magnetoresistive device (hereinafter often called the MR device for short) and a recording head having a write-only induction type magnetic device are stacked together.

The magnetoresistive device (CIP-GMR device) of the so-called CIP (current in plane) structure that operates on currents flowing parallel with the film plane of the device— called a spin valve GMR device—is now widely employed as the reproducing head. The spin valve GMR device of such structure is positioned between upper and lower shield layers one each formed of a soft magnetic metal film, and sandwiched between insulating layers called gap layers. Recording density in the bit direction is determined by the gap (shield gap or read gap lensgth) between the upper and lower shield layers.

With an increase in the recording density, there has been a growing demand for the reproducing device of the reproducing head to have narrower shield gaps and narrower tracks. As the reproducing head track grows narrow with a decreasing device height, so does the device area; however, with the prior art structure, there is an operating current limited from the standpoint of reliability, because there is heat dissipation efficiency decreasing with a decreasing area.

To solve such a problem, there is a GMR device with the CPP (current perpendicular to plane) structure (CPP-GMR device) proposed in the art, in which upper and lower shield layers and a magnetoresistive device are connected electrically in series to make do without any insulating layer between the shields. This technology is thought of as inevitable to achieve such recording densities as exceeding 200 Gbits/in$^2$.

Such a CPP-GMR device has a multilayer structure comprising a first ferromagnetic layer and a second ferromagnetic layer between which an electroconductive, nonmagnetic intermediate layer is sandwiched from both its sides. A typical multilayer structure for the spin valve type CPP-GMR device comprises, in order from a substrate side, a lower electrode/antiferromagnetic layer/first ferromagnetic layer/ electroconductive, nonmagnetic intermediate layer/second ferromagnetic layer/upper electrode stacked together in order.

The direction of magnetization of the first ferromagnetic layer that is one of the ferromagnetic layers remains fixed such that when an externally applied magnetic field is zero, it is perpendicular to the direction of magnetization of the second ferromagnetic layer. The fixation of the direction of magnetization of the first ferromagnetic layer is achieved by the exchange coupling of it with an antiferromagnetic layer provided adjacent to it, whereby unidirectional anisotropic energy (also called the "exchange bias" or "coupled magnetic field") is applied to the first ferromagnetic layer. For this reason, the first ferromagnetic layer is also called the fixed magnetization layer. By contrast, the second ferromagnetic layer is also called the free layer. Further, if the fixed magnetization layer (the first ferromagnetic layer) is configured as a triple-layer structure of a ferromagnetic layer/nonmagnetic metal layer/ferromagnetic layer (the so-called "multilayer ferri-structure" or "synthetic pinned layer"), it is then possible to give a strong exchange coupling between both ferromagnetic layers thereby effectively increasing the exchange coupling force from the antiferromagnetic layer, and to reduce influences on the free layer of a static magnetic field resulting from the fixed magnetization layer. Thus, the "synthetic pinned structure" is now in extensive use.

However, a further slimming-down of the magnetoresistive device is in great need so as to meet recent demands for ultra-high recording density. Such being the case, there is a novel GMR device structure put forward, which has a basic structure comprising a simple triple-layer arrangement of ferromagnetic layer (free layer)/nonmagnetic intermediate layer/ferromagnetic layer (free layer), as set forth typically in publication 1 (IEEE TRANSACTION ON MAGNETICS, VOL. 43, NO. 2, FEBRUARY, pp. 645-650 as well as U.S. Pat. No. 7,019,371B2 or U.S. Pat. No. 7,035,062B1.

For the sake of convenience, such structure is here called the dual free layer (DFL) device structure. In the DFL device structure, the two ferromagnetic layers are exchange coupled together such that their magnetizations are antiparallel with each other. And under the action of a bias magnetic field given out of a magnet located in a depth position opposite to the ABS corresponding to the surface of the device facing a medium, there is an initial state created in which the magnetizations of two magnetic layers (free layers) are inclined about 45° with respect to the track width direction. Upon detection of a signal magnetic field from the medium in the initial state of the device, the directions of magnetization of the two magnetic layers change as if scissors cut paper, with the result that there is a change in the resistance value of the device.

When such a DFL device structure is applied to the so-called TMR or CPP-GMR device, it is possible to make the gap (read gap length) between the upper and lower shield layers much narrower as compared with a conventional, ordinary spin valve type CPP-GMR device. Specifically, it is possible to make do without the aforesaid antiferromagnetic layer that is needed for the ordinary spin valve type CPP-GMR device as well as the ferromagnetic layers of the aforesaid "synthetic pinned structure". As a result, the "read gap layer" that has been said to be 30 nm at the very most can be reduced down to 20 nm or less.

A requirement for the formation of the prior art DFL device structure is that, as already noted, the two ferromagnetic layers (free layers) are exchange coupled together such that their magnetizations are mutually anti-parallel. Such a conventional basic structure is easily achievable by inserting Au, Ag, Cu, Ir, Rh, Ru, Cr or other noble metal between the two ferromagnetic layers (free layers) to generate an exchange coupling between them.

A problem with the TMR device, however, is that an insulating film such as an aluminum oxide ($AlO_x$) or magnesium oxide (MgO) film must be interposed between the two ferromagnetic layers (free layers), leading to the inability to obtain any strong exchange coupling between them. As a result, there is much difficulty in the anti-parallel coupling between the two ferromagnetic layers (free layers). Also, there is a technique known in the art (for instance, JP(A)2004-165254, JP Patent No. 3625199, JP(A)2002-208744 and so on), in which a NOL (nano-oxide-layer) is partially inserted between the two ferromagnetic layers (free layers) thereby boosting up the output of the CPP-GMR device. However, this technique cannot immediately be used because of the risk of the antiferromagnetic exchange coupling of the two ferromagnetic layers (free layers) growing very weak or vanishing off.

Further, U.S. Pat. No. 6,169,647B1 shows a technique of using two antiferromagnetic material layers to place the magnetizations of two ferromagnetic layers (free layers) in an antiparallel state (see FIG. 3 in particular). To make viable the structure according to this proposal, however, the antiferromagnetic material layers must each have a thickness of at least 5 nm that is contradictory to the purpose of curtailing the "read gap length". Another requirement is that the directions of exchange coupling generated from the two antiferromagnetic material layers be antiparallel with each other, rendering heat treatment (annealing) for achieving that very difficult. As device size gets narrow and small, it causes a decrease in the number of particles lined up to form the antiferromagnetic material layers and, hence, renders the so-called pinning action erratic (or insufficient), giving rise to inconvenience responsible for erratic performance.

The situations being like this, Applicant has already filed U.S. Ser. No. 11/946,358 for the purpose of providing a novel magnetoresistive device that makes it possible to achieve an antiparallel magnetization state for two ferromagnetic layers (free layers) with simple structure yet without being restricted by the material and specific structure of an intermediate film interposed between the two ferromagnetic layers (free layers), that makes it possible to improve on linear recording densities by the adoption of a structure capable of making the "read gap length" (the gap between the upper and lower shield layers) narrow thereby meeting recent demands for ultra-high recording densities, and that makes it possible to obtain stable magnetoresistive changes so that much higher reliability is achievable.

The invention of this application has for its object the provision of a magnetoresistive device that makes further progresses in the art of U.S. Ser. No. 11/946,358 already filed by Applicant, thereby stabilizing control of the domains of shield layers, reducing output fluctuations with respect to an external magnetic field, and improving more on the reliability of device operation.

SUMMARY OF THE INVENTION

According to the present invention, the aforesaid object is accomplished by the provision of a magnetoresistive device with a CPP (current perpendicular to plane) structure, comprising a magnetoresistive unit, and a first, substantially soft magnetic shield layer positioned below and a second, substantially soft magnetic shield layer positioned above, which are located and formed such that the magnetoresistive unit is sandwiched between them from above and below, with a sense current applied in the stacking direction, wherein said magnetoresistive unit comprises a non-magnetic intermediate layer, and a first ferromagnetic layer and a second ferromagnetic layer stacked and formed such that said nonmagnetic intermediate layer is interposed between them; each of said first shield layer positioned below and said second shield layer positioned above is configured in a frame shape form having a planar shape (X-Y plane) defined by the width and length directions of the device, wherein the framework for said first, and said second shield layer has a front frame-constituting portion located on a medium opposite plane side in front and near where the magnetoresistive unit is positioned; and each of the first ferromagnetic layer and second ferromagnetic layer forming said magnetoresistive unit receives action such that, under influences of magnetic action of the front frame-constituting portions for said first and second shield layers, there is an antiparallel magnetization state created, in which mutual magnetizations are in opposite directions.

In a preferable embodiment of the magnetoresistive device according to the invention, each of the frameworks for said first and second shield layers comprises a front frame-constituting portion located on the medium opposite plane side in front and near where the magnetoresistive unit is positioned and a side frame-constituting portion located at a side position extending from the end of said front frame-constituting portion in a rear direction; the width $Y_1$ of the side frame-constituting portion for said first shield layer is larger than the depth length $Y_2$ of the front frame-constituting portion for said first shield layer ($Y_1 > Y_2$); the width $Y_3$ of the side frame-constituting portion for said second shield layer is larger than the depth length $Y_4$ of the front frame-constituting portion for said second shield layer ($Y_3 > Y_4$); the side frame-constituting portion for said first shield layer partially comprises a combination of a first nonmagnetic gap layer with a first bias magnetic field-applying layer wherein said first nonmagnetic gap layer is designed and located in such a way as to efficiently send a magnetic flux given out of said first bias magnetic field-applying layer out to the front frame-constituting portion for said first shield layer, and the combination of said first nonmagnetic gap layer with said first bias magnetic field-applying layer forms a closed magnetic path with a magnetic flux going all the way around the frame shape forming said first shield layer and turns into a single domain the magnetization of the front frame-constituting portion for said first shield layer and control the direction of that magnetization; and the side frame-constituting portion for said second shield layer partially comprises a combination of a second nonmagnetic gap layer with a second bias magnetic field-applying layer wherein said second nonmagnetic gap layer is designed and located in such a way as to efficiently send a magnetic flux given out of said second bias magnetic field-applying layer out to the front frame-constituting portion for said second shield layer, and the combination of said second nonmagnetic gap layer with said second bias magnetic field-applying layer forms a closed magnetic path with a magnetic flux going all the way around the frame shape forming said second shield layer and turns into a single domain the magnetization of the front frame-constituting portion for said second shield layer and controls the direction of that magnetization.

In a preferable embodiment of the magnetoresistive device according to the invention, said first ferromagnetic layer forming a part of said magnetoresistive unit is indirectly magnetically coupled to the front frame-constituting portion for said first shield layer having a controlled direction of magnetization by way of a first exchange coupling function gap layer, and said second ferromagnetic layer forming a part of said magnetoresistive unit is indirectly magnetically coupled to the front frame-constituting portion for said second shield layer having a controlled direction of magnetization by way of a second exchange coupling function gap layer.

In a preferable embodiment of the magnetoresistive device according to the invention, said first exchange coupling function gap layer comprises, in order from said first shield layer side, an exchange coupling transfer layer, a gap adjustment layer and an exchange coupling adjustment layer, and said second exchange coupling function gap layer comprises, in order from said second shield layer side, an exchange coupling transfer layer, a gap adjustment layer and an exchange coupling adjustment layer.

In a preferable embodiment of the magnetoresistive device according to the invention, said exchange coupling transfer layer is made up of at least one material selected from the group consisting of Ru, Rh, Ir, Cr, Cu, Ag, Au, Pt, and Pd; said gap adjustment layer is made up of a ferromagnetic material; and said exchange coupling adjustment layer is made up of at least one material selected from the group consisting of Ru, Rh, Ir, Cr, Cu, Ag, Au, Pt, and Pd.

In a preferable embodiment of the magnetoresistive device according to the invention, said first exchange coupling function gap layer comprises, in order from said first shield layer side, an exchange coupling transfer layer, a gap adjustment layer, an exchange coupling transfer layer, a gap adjustment layer, and an exchange coupling adjustment layer, and said second exchange coupling function gap layer comprises, in order from said second shield layer side, an exchange coupling transfer layer, a gap adjustment layer, an exchange coupling transfer layer, a gap adjustment layer, and an exchange coupling adjustment layer.

In a preferable embodiment of the magnetoresistive device according to the invention, said nonmagnetic intermediate layer is made up of a triple-layer structure with ZnO located at the center thereof.

According to a preferable embodiment of the magnetoresistive device of the invention, in said first shield layer, $\Phi'b/\Phi'f(s)=0.3$ to $2.0$ where $\Phi'b$ is the total quantity of a magnetic flux flowing out of the first bias magnetic field-applying layer and $\Phi'f(s)$ is the saturation quantity of a magnetic flux for saturation magnetization of the front frame-constituting portion, and in said second shield layer, $\Phi b/\Phi f(s)\Phi f=0.3$ to $2.0$ where $\Phi b$ is the total quantity of a magnetic flux flowing out of the second bias magnetic field-applying layer and $\Phi f(s)$ is the saturation quantity of a magnetic flux for saturation of magnetization of the front frame-constituting portion.

In a preferable embodiment of the magnetoresistive device according to the invention, the width $Y_1$ of the side frame-constituting portion for said first shield layer is 1.4 to 10 times as large as the depth length $Y_2$ of the front frame-constituting portion for said first shield layer, and the width $Y_3$ of the side frame-constituting portion for said second shield layer is 1.4 to 10 times as large as the depth length $Y_4$ of the front frame-constituting portion for said second shield layer.

In a preferable embodiment of the magnetoresistive device according to the invention, said first nonmagnetic gap layer is buried in the side frame-constituting portion for said first shield layer and the first bias magnetic field-applying layer is formed adjacent to said first nonmagnetic gap layer; and said second nonmagnetic gap layer is buried in the side frame-constituting portion for said second shield layer and the second bias magnetic field-applying layer is formed adjacent to said second nonmagnetic gap layer.

In a preferable embodiment of the magnetoresistive device according to the invention, said first and second shield layers each have a thickness of 0.5 to 2.0 μm, and said first and second bias magnetic field-applying layers each have a thickness of 0.1 to 0.3 μm.

According to a preferable embodiment of the magnetoresistive device of the invention, in the length direction (Y-direction) of the depth side of said magnetoresistive unit there is a device bias magnetic field-applying layer formed to define a magnetization direction angle as an initial state with the first and second ferromagnetic layers functioning as free layers.

In a preferable embodiment of the magnetoresistive device according to the invention, said bias magnetic field-applying layers and device bias magnetic field-applying layer are magnetized integrally and simultaneously in the length direction (Y-direction).

In a preferable embodiment of the magnetoresistive device according to the invention, each of the frameworks for said first and second shield layers comprises a front frame-constituting portion located on the medium opposite plane side in front and near where the magnetoresistive unit is positioned, and a coil is wound around a part of each of the frameworks for said first and second shield layers, so that by a magnetic flux generated by passing a current through said coil, the front frame-constituting portion for each of said first and second shield layers is turned into a single domain and the direction of magnetization is controlled.

The invention also provides a thin-film magnetic head, comprising a plane in opposition to a recording medium, and the aforesaid magnetoresistive that is located near said medium opposite plane to detect a signal magnetic field from said recording medium.

Further, the invention provides a head gimbal assembly, comprising a slider including the aforesaid thin-film magnetic head and located in such a way as to oppose to a recording medium, and a suspension adapted to resiliently support said slider.

Yet Further, the invention provides a magnetic disk system, comprising a slider including the aforesaid thin-film magnetic head and located in such a way as to oppose to a recording medium, and a positioning device adapted to support and position said slider with respect to said recording medium.

EXPLANATION OF THE PREFERRED EMBODIMENTS

Figure 1:
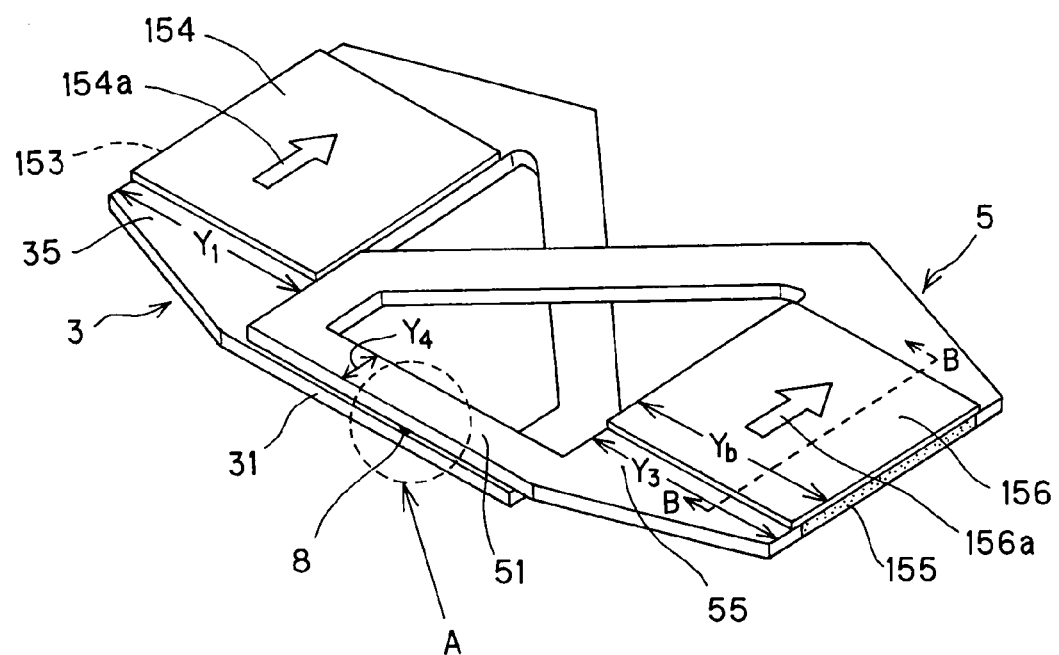
FIG. 1 is illustrative in perspective of the magnetoresistive device according to an embodiment of the invention, as viewed from the ABS (air bearing surface) direction.

The best mode for carrying out the invention is now explained in greater details.

The magnetoresistive device of the invention is preferably used with a thin-film magnetic head in general and a reproducing head in particular.

In the following disclosure of the invention, the sizes of each device component in the X-, Y- and Z-axis directions shown in the drawings will be referred to as the "width", "length" and "thickness", respectively.

The side of the device nearer to the air bearing surface (the plane of the thin-film magnetic head in opposition to the recording medium) in the Y-axis direction will be called "forward" and the opposite side (depth side) will be called "rearward", and the direction of stacking the individual films up will be called "upward" or "upper side" and the opposite direction will be called "downward" or "lower side".

FIG. 1 is illustrative in perspective of the magnetoresistive device according to an embodiment of the invention, as viewed from the ABS (air bearing surface) direction. The ABS is generally corresponding to a plane (hereinafter often called the medium opposite plane) at which the device lies in opposition to the recording medium; however, it is understood that the ABS here includes even a section at a position where the multilayer structure of the device can be clearly observed. For instance, a protective layer of DLC (the protective layer adapted to cover the device) or the like, in a strict sense, positioned facing the medium opposite plane may be factored out, if necessary. In a broader concept, the magnetoresistive device here is understood to encompass upper and lower shield layers as well.

Figure 2:
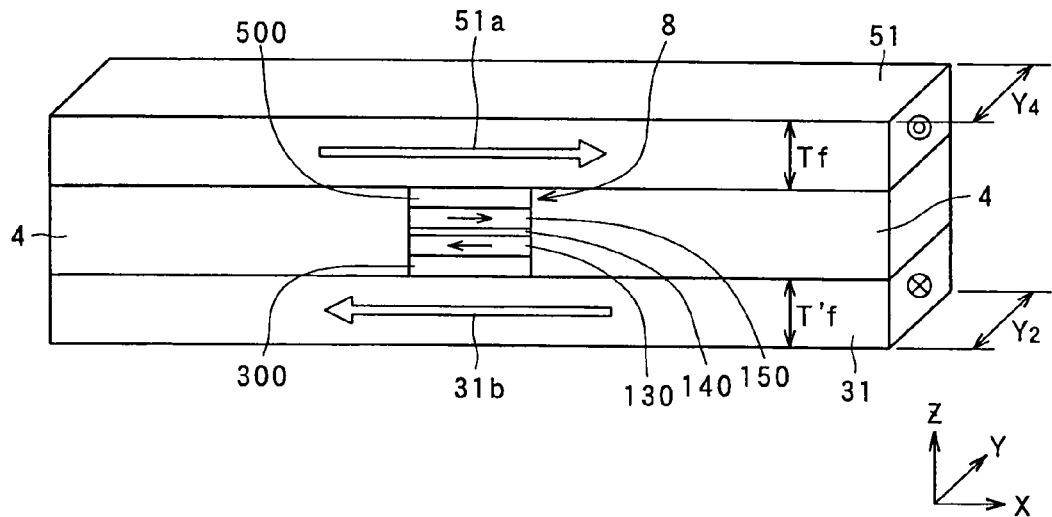
FIG. 2 is illustrative in perspective of the device structure of an area A encircled by a dotted line in FIG. 1 and near the ABS.

FIG. 2 is a perspective view illustrative of the device structure near the ABS of an area A encircled by a dotted line in FIG. 1.

Figure 3:
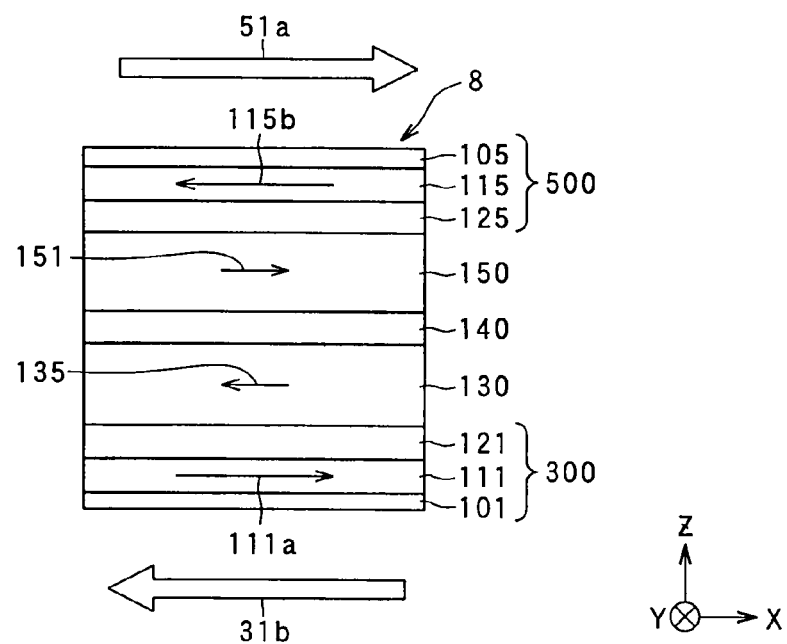
FIG. 3 is an enlarged schematic view of the magnetoresistive unit in the magnetoresistive device of FIG. 2 including a sensor area.

FIG. 3 is an enlarged schematic view of the magnetoresistive unit in the magnetoresistive device of FIG. 2 including a sensor area.

Figure 4:
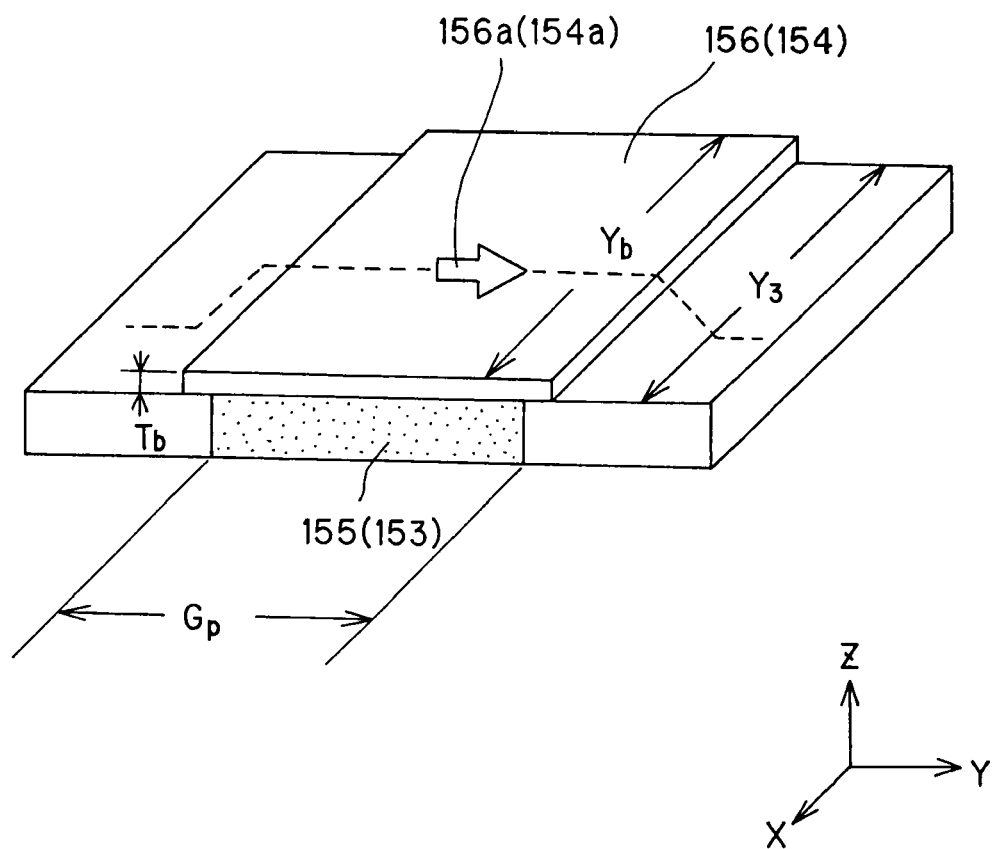
FIG. 4 is a view of FIG. 1 as taken on an arrowed B-B section.

FIG. 4 is a sectional view of FIG. 1 as taken on a arrowed B-B section of FIG. 1.

Figure 5:
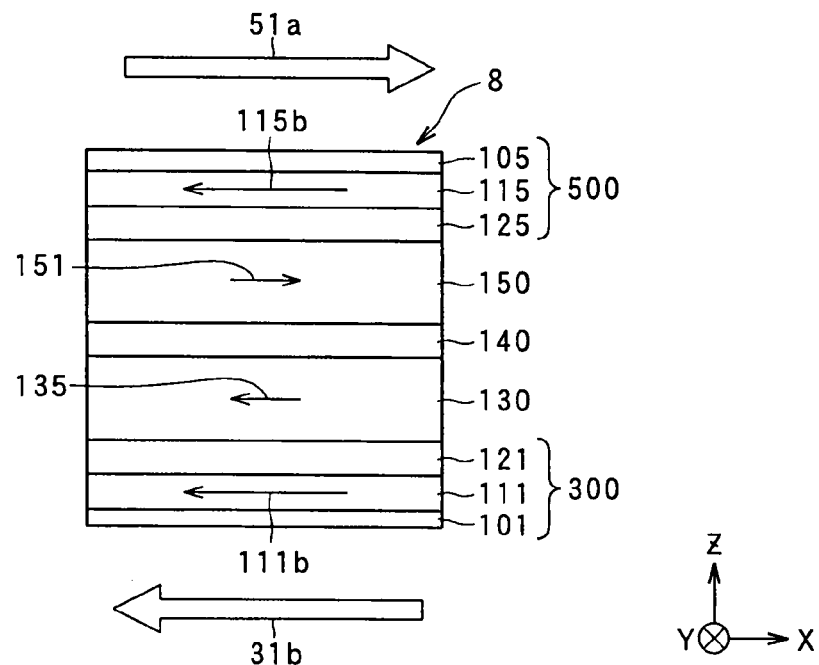
FIG. 5 is illustrative of, as in FIG. 3, of a modification to the construction of the magnetoresistive unit.
Figure 6:
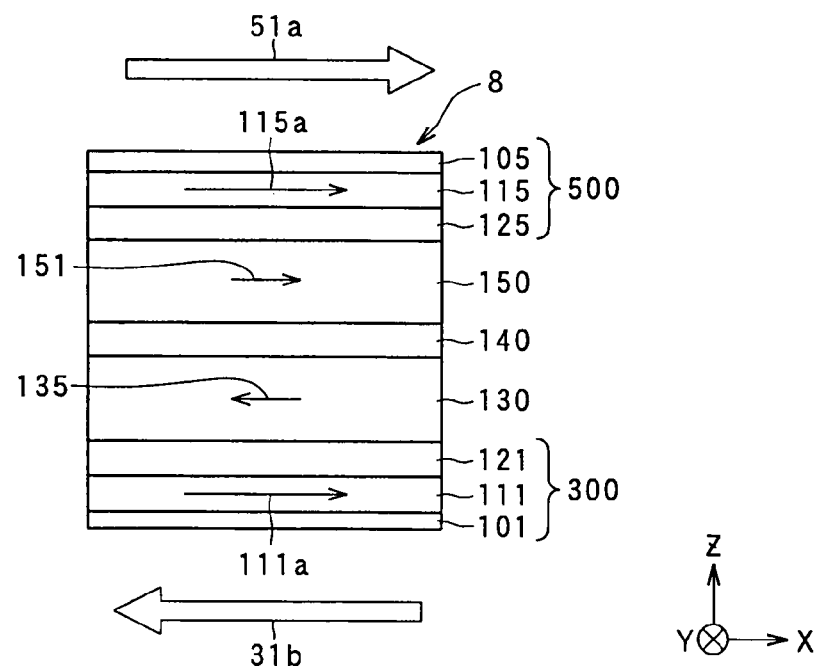
FIG. 6 is illustrative of, as in FIG. 3, of another modification to the construction of the magnetoresistive unit.
Figure 7:
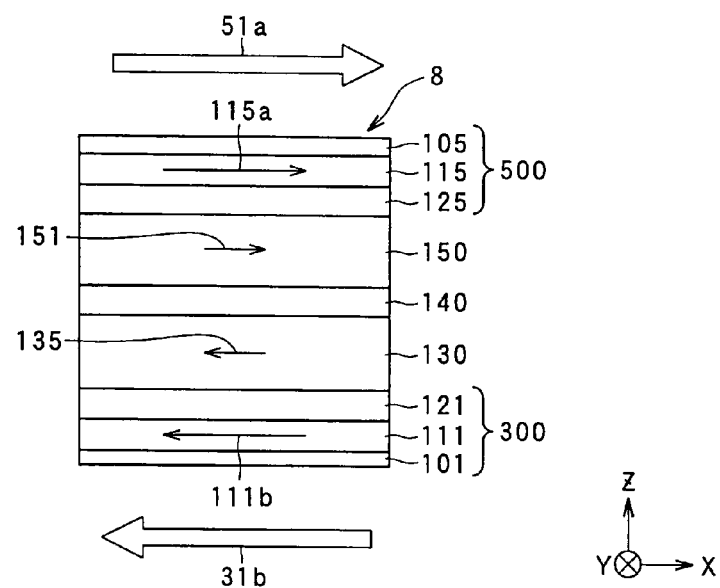
FIG. 7 is illustrative of, as in FIG. 3, of yet another modification to the construction of the magnetoresistive unit.

FIGS. 5, 6 and 7 are each illustrative, as in FIG. 3, of a modification to of the construction of the magnetoresistive unit.

[Explanation of the Structure of the Magnetoresistive Device]

As shown in FIGS. 1 and 2, the magnetoresistive device of the invention comprises a magnetoresistive unit 8, and a first, substantially soft magnetic shield layer 3 (also called the lower shield layer 3) that is positioned below and a second, substantially soft magnetic shield layer 5 (also called the upper shield layer 5) that is located above wherein those shield layers are located and formed such that the magnetoresistive unit 8 is substantially sandwiched between them from above and below.

And the magnetoresistive device of the invention is a magnetoresistive device with the CPP (current perpendicular to plane) structure with a sense current applied in the stacking direction (Z-direction) of the magnetoresistive unit 8.

As shown in FIG. 2, the magnetoresistive unit 8 comprises a nonmagnetic intermediate layer 140, and a first 130 and a second ferromagnetic layer 150 stacked and formed such that the nonmagnetic intermediate layer 140 is sandwiched between them.

In the invention, the second shield layer 5 positioned above is configured in an endless (continual) frame shape having a planar shape (X-Y plane) defined by the width and length directions of the device, as shown in FIG. 1. Likewise in the invention, the first shield layer 3 that is positioned below, too, is configured in an endless (continual) frame shape, as is the case with the second shield layer 5. Reference is now made to the second shield layer 5 that is positioned above and the first shield layer 3 that is positioned below.

[Explanation of the Second Shield Layer 5]

As shown in FIG. 1, the framework for the second shield layer 5 that is positioned above comprises a flat plate form of front frame-constituting portion 51 located on a medium opposite plane side (ABS) in front and near where the magnetoresistive unit 8 is positioned and extending in the width (X) direction, and a side frame-constituting portion 55 located at a side position from the end of that front frame-constituting portion 51 (the right side end of FIG. 1) in the rear direction (Y-direction).

As can be seen from what is illustrated in FIG. 1, the width $Y_3$ of the side frame-constituting portion 55 is larger than the depth length $Y_4$ of the front frame-constituting portion ($Y_3 > Y_4$). More preferably, the width $Y_3$ of the side frame-constituting portion 55 is set 1.4 to 10 times as large as the depth length $Y_4$ of the front frame-constituting portion 51.

Why such requirements are in need originates from (1) the relationship between the thickness of a bias magnetic field-applying layer 156 formed on the shield and the thickness of the front frame-constituting portion 51 for the second shield layer 5 formed, and results eventually from (2) the relationship between the total quantity Φb fib of a magnetic flux flowing out of the bias magnetic field-applying layer 156 and the saturation quantity Φf(s) of a magnetic flux for the saturation of the magnetization of the front frame-constituting portion 51 where the magnetoresistive unit 8 is positioned, as will be described later.

As already mentioned, the side frame-constituting portion 55 for the second shield layer 5 partially comprises a combination of a second nonmagnetic gap layer 155 with the second bias magnetic field-applying layer 156, as shown in FIGS. 1 and 4.

The second nonmagnetic gap layer 155 is designed and located such that it works to efficiently send a magnetic flux (indicated by 156a) given out of the second bias magnetic field-applying layer 156 out to the side of the front frame-constituting portion 51 for the second shield layer 55, and the combination of the second nonmagnetic gap layer 155 with the second bias magnetic field-applying layer 156 is set up in such a way as to form a closed magnetic path with a magnetic flux going all the way around the frame shape forming the second shield layer 5 (a counterclockwise one in the embodiment illustrated in FIG. 1), and turn into a single domain the magnetization of the front frame-constituting portion 51 for the second shield layer 5 where the magnetoresistive unit 8 is positioned and control the direction of that magnetization.

Other than the combination of the nonmagnetic gap layer 155 with the bias magnetic field-applying layer 156, the second shield layer 5 is made of a high-permeable, soft magnetic material (e.g., permalloy); this is the reason there is the "second, substantially soft magnetic shield layer 5" involved in the invention of this application.

As shown in FIG. 4, the nonmagnetic gap layer 155 is buried in the side frame-constituting portion 55, and the bias magnetic field-applying layer 156 is formed adjacent to that nonmagnetic gap layer 155. In the embodiment shown, the bias magnetic field-applying layer 156 is formed on the nonmagnetic gap layer 155. In the embodiment illustrated, the soft magnetic member of the second shield layer 5 is broken on the way by the nonmagnetic gap layer 155; however, the soft magnetic member of the second shield layer 5 may just as well be broken on the way by a multilayer structure of the nonmagnetic gap layer 155 and bias magnetic field-applying layer 156.

In the invention, the action of the nonmagnetic gap layer 155 is of vital importance; it is of much importance to design and locate it such that the magnetic flux given out of the bias magnetic field-applying layer 156 is efficiently sent out to the side of the front frame-constituting portion 51.

If, in FIG. 4, the nonmagnetic gap layer 155 is removed and instead the soft magnetic member of the second shield layer 5 is used there, then there would be inconvenience that much of the magnetic flux given out of the bias magnetic field-applying layer 156 returns back through the soft magnetic member used there. In other words, it would be impossible to efficiently send the magnetic flux given out of the bias magnetic field-applying layer 156 out to the side of the aforesaid front frame-constituting portion 51.

From such a point of view, the combination of the nonmagnetic gap layer 155 with the bias magnetic field-applying layer 156 here is designed and set up such that there is a closed magnetic path formed with a magnetic flux going all the way around the frame shape forming the second shield layer 5, and the magnetization of the front frame-constituting portion 51 where the magnetoresistive unit 8 is positioned is turned into a single domain. As shown in FIG. 4, the Y-direction length Gp of the nonmagnetic gap layer 155 is preferably greater than the thickness Tf of the shield film, and the Y-direction length of the bias magnetic field-applying layer 156 is preferably roughly at least 5 times as large as the thickness Tb of the bias magnetic field-applying layer 156. Upper limits to both the Y-direction length Gp of the nonmagnetic gap layer 155 and the Y-direction length of the bias magnetic field-applying layer 156, respectively, are defined by shield shape, and preferably smaller than the width d shown in FIG. 1.

Especially in the invention, to turn into a single domain the magnetization of the front frame-constituting portion 51 where the magnetoresistive unit 8 is positioned, it is desired that the value of $\Phi b/\Phi f(s)$ be in the range of 0.3 to 2.0, preferably 0.8 to 2.0, where $\Phi b$ is the total quantity of the magnetic flux flowing out of the bias magnetic field-applying layer 156 and $\Phi f(s)$ is the saturation quantity of the magnetic flux for the saturation of the magnetization of the front frame-constituting portion 51 where the magnetoresistive unit 8 is positioned.

The total quantity $\Phi b$ of the magnetic flux flowing out of the bias magnetic field-applying layer 156 is represented in terms of the product of the residual magnetic flux density Brb of the material forming the bias magnetic field-applying layer 156 and the sectional area Sb of the magnetic flux flowing out of the bias magnetic field-applying layer 156: $\Phi b = Brb \times Sb$. Note here that the sectional area Sb is an X-Z plane represented by thickness Tb×depth length Yb shown in FIG. 4 ($Sb = Tb \times Yb$). Usually, the depth length Yb of the bias magnetic field-applying layer 156 is supposed to be equal to the length $Y_3$ ($Yb = Y_3$).

The saturation quantity $\Phi f(s)$ of the magnetic flux for the saturation of the magnetization of the front frame-constituting portion 51 where the magnetoresistive device 8 is positioned is represented in terms of the product of the saturation magnetic flux density Bsf of the material forming the front frame-constituting portion 51 and the sectional area Sf of the front frame-constituting portion 51: $\Phi f(s) = Bsf \times Sf$. Note here that the sectional area Sf is a Y-Z plane represented by thickness Tf×depth length $Y_4$ shown in FIGS. 1 and 2 ($Sf = Tf \times Y_4$).

Usually, the thickness Tf of the front frame-constituting portion 51 that is the same as the thickness of the second shield layer 5 should be 0.5 to 2.0 µm. This is the thickness necessary for letting the shield layer have the so-called magnetic shield function, and that shield layer is formed by the so-called plating.

On the other hand, the bias magnetic field-applying layer 156 should have a thickness Tb of 0.1 to 0.3 µm. The film of that bias magnetic field-applying layer 156 is formed by sputtering; exceeding that upper limit would incur some considerable economical losses, and falling short of that lower limit would render it less likely for the bias magnetic field-applying layer to have its own function.

Given a difference between such film thicknesses Tf and Tb, it is required to meet the aforesaid desirous numerical requirements such that the magnetic flux flowing out of the bias magnetic field-applying layer 156 can get to the front frame-constituting portion 51 where the magnetoresistive unit 8 is positioned, and the magnetic flux necessary for turning the magnetization of the front frame-constituting portion 51 into a single domain is obtainable.

It is noted that one exemplary size for the front frame-constituting portion 51 is $Y_4 = 5$ µm, Tf=1 µm, and X-direction width=30 µm.

For the bias magnetic field-applying layer 156, for instance, a hard magnetic layer (hard magnet), or a multilayer structure of a ferromagnetic layer and an anti-ferromagnetic layer is used. Specifically, CoPt or CoCrPt is mentioned for the former, and a multilayer structure of CoFe and IrMr is mentioned for the latter.

For the nonmagnetic gap layer 155, there is the mention of oxides such as alumina and silica; nitrides such as alumina nitride and silicon nitride; and nonmagnetic metals such as Cr, Ta, NiCr, Au and Cu.

Between the nonmagnetic gap layer 155 and the bias magnetic field-applying layer 156, it is desired to interpose an underlay layer and a buffer layer. It follows that, in a preferable embodiment of the invention, the underlay layer and buffer layer are formed on the non-magnetic gap layer 155 in order, and the bias magnetic field-applying layer 156 is formed on the buffer layer.

The underlay layer is provided mainly for the purpose of making the surface of the nonmagnetic gap layer 155 flat, and Ti, Ta or the like is used for it. The thickness should be about 1 to 5 nm.

The buffer layer is used for the purpose of improving on the crystallizablity and orientation of the bias magnetic field-applying layer 156. When the bias magnetic field-applying layer 156 is formed of a hard magnetic layer (hard magnet), Cr, CrTi or the like is used as the buffer layer material with a thickness of about 2 to 10 nm. When the bias magnetic field-applying layer 156 is formed of a multilayer structure of a ferromagnetic layer and an antiferromagnetic layer, Ru, NiCr or the like is used as the buffer layer material with a thickness of about 2 to 10 nm.

Both the underlay layer and the buffer layer are preferably used; however, only one may be used or none of them may be used.

For the substantially soft magnetic material for the second shield layer 5, there is the mention of NiFe (permalloy), CoZrTa, sendust, NiFeCo, CoZrNb, and so on.

[Explanation of the First Shield Layer 3]

It is desired that the first shield layer 3 that is positioned below, too, is configured as is the case with the aforesaid second shield layer 5.

That is, the framework for the first shield layer 3 that is positioned above comprises a flat plate form of front frame-constituting portion 31 located on the medium opposite surface side (ABS) in front and near where the magnetoresistive unit 8 is positioned and extending in the width (X) direction, and a side frame-constituting portion 35 located at a side position from the end of that front frame-constituting portion 31 (the left side end of FIG. 1) in the rear direction (Y-direction), as shown in FIG. 1

The width $Y_1$ (see FIG. 1) of the side frame-constituting portion 35 is larger than the depth length $Y_2$ (see FIG. 2) of the front frame-constituting portion 31 ($Y_1 > Y_2$). More preferably, the width $Y_1$ of the side frame-constituting portion 35 is set 1.4 to 10 times as large as the depth length $Y_2$ of the front frame-constituting portion 31.

It is here noted that the front frame-constituting portion 31 for the first shield layer 3 is difficult to understand because of being shown as overlapping; for the depth length $Y_2$, see FIG. 2.

Why such requirements are in need originates from (1) the relationship between the thickness of a bias magnetic field-applying layer 154 formed on the shield and the thickness of the front frame-constituting portion 31 for the first shield layer 3 formed, and eventually from (2) the relationship between the total quantity $\Phi'b$ of a magnetic flux flowing out of the bias magnetic field-applying layer 154 and the saturation quantity $\Phi'f(s)$ of a magnetic flux for the saturation of the magnetization of the front frame-constituting portion 31 where the magnetoresistive unit 8 is positioned, as will be described later.

As already mentioned, the side frame-constituting portion 35 for the first shield layer 3 partially comprises a combination of a first nonmagnetic gap layer 153 with the first bias magnetic field-applying layer 154. The first nonmagnetic gap layer 153 is designed and located such that it works to efficiently send a magnetic flux given out of the first bias magnetic field-applying layer 154 out to the side of the front frame-constituting portion 31 for the first shield layer 3, and the combination of the first nonmagnetic gap layer 153 with the first bias magnetic field-applying layer 154 is set up in such a way as to form a closed magnetic path with a magnetic flux going all the way around the frame shape forming the first shield layer 3 (a clockwise one in the embodiment illustrated in FIG. 1), and turn into a single domain the magnetization of the front frame-constituting portion 31 for the first shield layer 3 where the magnetoresistive unit 8 is positioned and control the direction of that magnetization.

The construction of the first nonmagnetic gap layer 153 is difficult to understand from what is shown in FIG. 1; to have an understanding of its specific construction, see FIG. 4.

Other than the combination of the nonmagnetic gap layer 153 with the bias magnetic field-applying layer 154, the first shield layer 3 is made of a high-permeable, soft magnetic material; this is the reason there is the "first, substantially soft magnetic shield layer 3" involved in the invention of this application.

The nonmagnetic gap layer 153 is buried in the side frame-constituting portion 35, and the bias magnetic field-applying layer 154 is formed adjacent to that nonmagnetic gap layer 153 (see FIG. 4). In the embodiment shown in FIG. 4, the bias magnetic field-applying layer 154 is formed on the nonmagnetic gap layer 153. In the embodiment illustrated, the soft magnetic member of the first shield layer 3 is broken by the nonmagnetic gap layer 153; however, the soft magnetic member of the first shield layer 3 may just as well be broken by a multilayer structure of the nonmagnetic gap layer 153 and bias magnetic field-applying layer 154.

In the invention, the action of the nonmagnetic gap layer 153 is of vital importance; it is of much importance to design and locate it such that the magnetic flux given out of the bias magnetic field-applying layer 154 is efficiently sent out to the side of the front frame-constituting portion 31.

That is, the combination of the nonmagnetic gap layer 153 with the bias magnetic field-applying layer 154 here is designed and set up such that there is a closed magnetic path formed with a magnetic flux going all the way around the frame shape forming the first shield layer 3, and the magnetization of the front frame-constituting portion 31 where the magnetoresistive unit 8 is positioned is turned into a single domain. The Y-direction length of the nonmagnetic gap layer 153 may be set as is the case with the aforesaid nonmagnetic gap layer 155, and the Y-direction length of the bias magnetic field-applying layer 154 may be set as is the case with the aforesaid bias magnetic field-applying layer 156.

Especially in the invention, to turn into a single domain the magnetization of the front frame-constituting portion 31 where the magnetoresistive unit 8 is positioned, it is desired that the value of $\Phi'b/\Phi'f(s)$ be in the range of 0.3 to 2.0, preferably 0.8 to 2.0, where $\Phi'b$ is the total quantity of the magnetic flux flowing out of the bias magnetic field-applying layer 156 and $\Phi'f(s)$ is the saturation quantity of the magnetic flux for the saturation of the magnetization of the front frame-constituting portion 31 where the magnetoresistive unit 8 is positioned.

The total quantity $\Phi'b$ of the magnetic flux flowing out of the bias magnetic field-applying layer 154 is represented in terms of the product of the residual magnetic flux density Brb of the material forming the bias magnetic field-applying layer 154 and the sectional area Sb of the magnetic flux flowing out of the bias magnetic field-applying layer 154: $\Phi'b = Brb \times Sb$. Note here that the sectional area Sb is an X-Z plane.

The saturation quantity $\Phi'f(s)$ of the magnetic flux for the saturation of the magnetization of the front frame-constituting portion 31 where the magnetoresistive device 8 is positioned is represented in terms of the product of the saturation magnetic flux density Bsf of the material forming the front frame-constituting portion 31 and the sectional area Sf of the front frame-constituting portion 31. Note here that the sectional area Sf is a Y-Z plane.

The thickness T'f of the front frame-constituting portion 31 that is the same as the thickness of the first shield layer 3 should be 0.5 to 2.0 µm. This is the thickness necessary for letting the shield layer have the so-called magnetic shield function, and that shield layer is formed by the so-called plating.

On the other hand, the bias magnetic field-applying layer 154 should have a thickness T'b of 0.1 to 0.3 µm. The film of that bias magnetic field-applying layer 154 is formed by sputtering; exceeding that upper limit would incur some considerable economical losses, and falling short of that lower limit would render it less likely for the bias magnetic field-applying layer to have its own function.

Given a difference between such film thicknesses T'f and T'b, it is required to meet the aforesaid desirous numerical requirements such that the magnetic flux flowing out of the bias magnetic field-applying layer 154 can get to the front frame-constituting portion 31 where the magnetoresistive unit 8 is positioned, and the magnetic flux necessary for turning the magnetization of the front frame-constituting portion 31 into a single domain is obtainable.

It is noted that one exemplary size for the front frame-constituting portion 31 is $Y_2$=5 µm (see FIG. 2), T'f=1 µm, and X-direction width=30 µm.

For the bias magnetic field-applying layer 154, for instance, a hard magnetic layer (hard magnet), or a multilayer structure of a ferromagnetic layer and an anti-ferromagnetic layer is used. Specifically, CoPt or CoCrPt is mentioned for the former, and a multilayer structure of CoFe and IrMr is mentioned for the latter.

For the nonmagnetic gap layer 153, there is the mention of oxides such as alumina and silica; nitrides such as alumina nitride and silicon nitride; and nonmagnetic metals such as Cr, Ta, NiCr, Au and Cu.

Between the nonmagnetic gap layer 153 and the bias magnetic field-applying layer 154, it is desired to interpose an underlay layer and a buffer layer. It follows that, in a preferable embodiment of the invention, the underlay layer and buffer layer are formed on the non-magnetic gap layer 153 in order, and the bias magnetic field-applying layer 154 is formed on the buffer layer.

The underlay layer is provided mainly for the purpose of making the surface of the nonmagnetic gap layer 153 flat, and Ti, Ta or the like is used for it. The thickness should be about 1 to 5 nm.

The buffer layer is used with a view to improving on the crystallizablity and orientation of the bias magnetic field-applying layer 154. When the bias magnetic field-applying layer 154 is formed of a hard magnetic layer (hard magnet), Cr, CrTi or the like is used as the buffer layer material with a thickness of about 2 to 10 nm. When the bias magnetic field-applying layer 154 is formed of a multilayer structure of a ferromagnetic layer and an anti-ferromagnetic layer, Ru, NiCr or the like is used as the buffer layer material with a thickness of about 2 to 10 nm.

Both the underlay layer and the buffer layer are preferably used; however, only one may be used or none of them may be used.

For the substantially soft magnetic material for the first shield layer 3, there is the mention of NiFe (permalloy), CoZrTa, sendust, NiFeCo, CoZrNb, and so on.

In the invention, the aforesaid first shield layer 3 and second shield layers in general, and the front frame-constituting portions 31 and 51 in particular have:

(1) a function of shielding off magnetism from an external magnetic field, (2) an electrode function, and (3) a function of giving magnetic action to the first 130 and the second ferromagnetic layer 150 such that there is an antiparallel magnetization state created in which their magnetization directions are opposite to each other.

In the invention, it is the function (3) that is particularly noteworthy.

To let the aforesaid function (3) take effect, the front frame-constituting portion 31 for the first shield layer 3, and the front frame-constituting portion 51 for the second shield layer 5 has its magnetization direction controlled by the combination of the nonmagnetic gap layer with the bias magnetic field-applying layer (magnetization direction control means), as noted above.

In the embodiment shown in FIG. 2, the front frame-constituting portion 31 for the first shield layer 3 has its magnetization fixed in the minus width direction (−X direction indicated by 31b) from the right to the left side of the paper. By contrast, the front frame-constituting portion 51 for the second shield layer 5 has its magnetization direction fixed in the plus width direction (+X direction indicated by 51a) from the left to the right side of the paper.

In other words, the front frame-constituting portion 31 for the first shield layer 3, and the front frame-constituting portion 51 for the second shield layer 5 is constructed in such a way as to have a single domain structure through the combination of the nonmagnetic gap layer with the bias magnetic field-applying layer (magnetization direction control means). It is here noted that the front frame-constituting portion 31 for he first shield layer 3 and the front frame-constituting portion 51 for the second shield layer 5 may have mutual magnetization directions opposite to those shown.

(Explanation of the Magnetoresistive Unit 8)

As shown in FIG. 2, there is the magnetoresistive unit 8 interposed between the front frame-constituting portion 31 for the first shield layer 3 and the front frame-constituting portion 51 for the second shield layer 5. And on each side of the magnetoresistive unit 8 there is a nonmagnetic layer 4 made of alumina ($Al_2O_3$) or the like located to define the reading track width.

As shown in FIG. 2, the magnetoresistive unit 8 comprises a sensor area positioned at substantially the center of the multilayer film and comprising the first ferromagnetic layer 130, nonmagnetic intermediate layer 140 and second ferromagnetic layer 150, and the first 300 and the second exchange coupling function gap layer 500 that are interposed between that sensor area, and the front frame-constituting portion 31 for the first shield layer 3 and the front frame-constituting portion 51 for the second shield layer 5, respectively.

Between the sensor area and the front frame-constituting portion 31 for the first shield layer 3, and between the sensor area and the front frame-constituting portion 51 for the second shield layer 5, there is a given gap needed corresponding to the recording density. This is to make sure the capturing in the sensor area of only the external magnetic field as signals. As the gap grows larger than necessary, there is a risk of capturing not only the signal magnetic field but also adjacent other signal magnetic fields. Conversely, as the gap is way too smaller than the necessary distance, there is a risk of the signal magnetic field being drawn in the front frame-constituting portions 31 and 51 for the shield layers 3 and 5 surrounding the sensor area rather than in the sensor area.

It goes without saying that the first 300 and the second exchange coupling function gap layer 500 must have such a gap function. Added to this in the invention, the first 300 and the second exchange coupling function gap layer 500 must be made up of such a multilayer structure as explained below for the purpose of letting the key function (characteristic function) of the invention show up.

Explanation of the First Exchange Coupling Function Gap Layer 300

As shown in FIG. 3, the first exchange coupling function gap layer 300 comprises, in order from the side of the front frame-constituting portion 31 for the first shield layer 3, an exchange coupling transfer layer 101, a gap adjustment layer 111 and an exchange coupling adjustment layer 121. The gap adjustment layer 111 is a so-called ferromagnetic layer made of a ferromagnetic material.

The exchange coupling transfer layer 101 is made of at least one material selected from the group consisting of Ru, Rh, Ir, Cr, Cu, Ag, Au, Pt and Pd: it is capable of adjusting the strength of magnetic coupling of the magnetization 31b of the front frame-constituting portion 31 for the first shield layer 3 to the magnetization 111a of the gap adjustment layer 111 depending on what material is selected and what thickness it is set at. As the material to be used is determined and its thickness is set, the direction of the magnetization 111a of the gap adjustment layer 111 magnetically coupled to the magnetization 31b of the front frame-constituting portion 31 for the first shield layer 3 is also determined. To put it another way, whether there is antiferromagnetic coupling (where the magnetizations are magnetically coupled together in opposite directions) or ferromagnetic coupling (where the magnetizations are magnetically coupled together in the same direction) is determined.

The exchange coupling adjustment layer 121 is made of at least one material selected from the group consisting of Ru, Rh, Ir, Cr, Cu, Ag, Au, Pt and Pd: it is capable of adjusting the strength of magnetic coupling of the magnetization 111a of the gap adjustment layer 111 to the magnetization 135 of the first ferromagnetic layer 130 depending on what material is selected and what thickness it is set at. As the material to be used is determined and its thickness is set, the direction of the magnetization 135 of the first ferromagnetic layer 130 magnetically coupled to the magnetization 111a of the gap adjustment layer 111 is also determined. To put it another way, whether there is antiferromagnetic coupling or ferromagnetic coupling is determined.

The requirement for the invention is that the first ferromagnetic layer 130 functions as the so-called free layer that responds to the external magnetic field with high sensitivity. To this end, the first ferromagnetic layer 130 is set such that the strength of magnetic coupling of the magnetization 31b of the front frame-constituting portion 31 for the first shield layer 3 to the magnetization 111a of the gap adjustment layer 111 grows strong, and the strength of the magnetization 111a of the gap adjustment layer 111 to the magnetization 135 of the first ferromagnetic layer 130 gets relatively weak.

The first exchange coupling function gap 300 has a thickness set at about 1.5 to 6.0 nm.

Explanation of the Second Exchange Coupling Function Gap Layer 500

As shown in FIG. 3, the second exchange coupling function gap layer 500 comprises, in order from the side of the front frame-constituting portion 51 for the second shield layer 5, an exchange coupling transfer layer 105, a gap adjustment layer 115 and an exchange coupling adjustment layer 125. The gap adjustment layer 115 is a so-called ferromagnetic layer made of a ferromagnetic material.

The exchange coupling transfer layer 105 is made up of at least one material selected from the group consisting of Ru, Rh, Ir, Cr, Cu, Ag, Au, Pt and Pd: it is capable of adjusting the strength of magnetic coupling of the magnetization 51a of the front frame-constituting portion 51 for the second shield layer 5 to the magnetization 115b of the gap adjustment layer 115 depending on what material is selected and what thickness it is set at. As the material to be used is determined and its thickness is set, the direction of the magnetization 115b of the gap adjustment layer 115 magnetically coupled to the magnetization 51a of the front frame-constituting portion 51 for the second shield layer 5 is also determined. To put it another way, whether there is antiferromagnetic coupling (where the magnetizations are magnetically coupled together in opposite directions) or ferromagnetic coupling (where the magnetizations are magnetically coupled together in the same direction) is determined.

The exchange coupling adjustment layer 125 is made of at least one material selected from the group consisting of Ru, Rh, Ir, Cr, Cu, Ag, Au, Pt and Pd: it is capable of adjusting the strength of magnetic coupling of the magnetization 115b of the gap adjustment layer 115 to the magnetization 151 of the second ferromagnetic layer 150 depending on what material is selected and what thickness it is set at. As the material to be used is determined and its thickness is set, the direction of the magnetization 151 of the second ferromagnetic layer 150 magnetically coupled to the magnetization 115b of the gap adjustment layer 115 is also determined. To put it another way, whether there is antiferromagnetic coupling or ferromagnetic coupling is determined.

The requirement for the invention is that the second ferromagnetic layer 150 functions as the so-called free layer that responds to the external magnetic field with high sensitivity. To this end, the second ferromagnetic layer 150 is set such that the strength of magnetic coupling of the magnetization 51a of the front frame-constituting portion 51 for the second shield layer 5 to the magnetization 115b of the gap adjustment layer 115 grows strong, and the strength of the magnetization 115b of the gap adjustment layer 115 to the magnetization 151 of the second ferromagnetic layer 150 gets relatively weak.

The second exchange coupling function gap 500 has a thickness set at about 1.5 to 6.0 nm.

Explanation of the Adjustment of the Strength of Magnetic Coupling (the Strength of the Exchange Coupled Magnetic Field)

The adjustment of the strength of magnetic coupling (the strength of the exchange coupled magnetic field) is now explained with reference to FIGS. 10 and 11.

Figure 10:
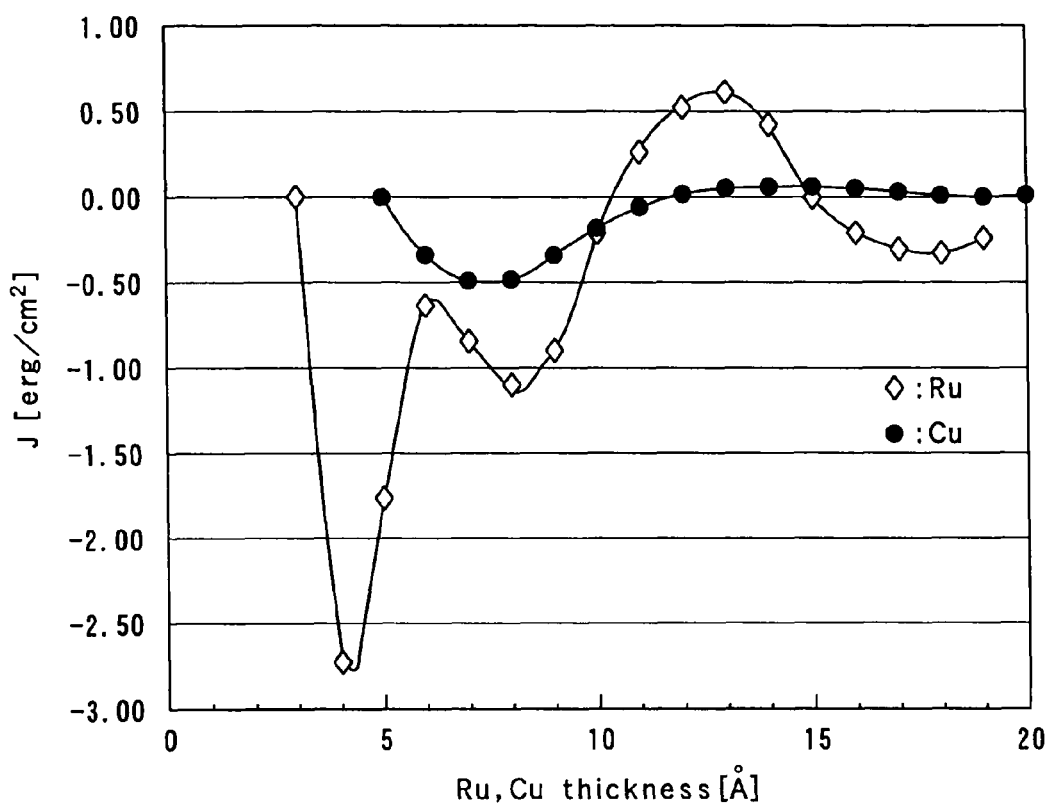
FIG. 10 is a graph indicative of the thickness t (Å) of Ru and Cu vs. the exchange coupled magnetic field strength J (erg/cm$^2$) in the event that Ru and Cu are used as the materials to form the exchange coupling transfer layer 101, 105 and the exchange coupling adjustment layer 121, 125.

FIG. 10 is a graph indicative of the thickness t (Å) of Ru, and Cu vs. the exchange coupled magnetic field strength J (erg/cm$^2$) in the event that Ru, and Cu is used for the material forming the exchange coupling transfer layer 101, 105 and the exchange coupling adjustment layer 121, 125. This graph has been prepared using a $Co_{90}Fe_{10}$ alloy for the magnetic material subjected to exchange coupling with Ru or Cu held in place. FIG. 11 is a graph indicative of the Cu thickness t (Å) vs. the exchange coupled magnetic field strength J (erg/cm$^2$): it is basically and substantially the same as the graph of FIG. 10 concerning Cu. In particular, however, the scale span for the exchange coupled magnetic field strength J (erg/cm$^2$) indicated on ordinate is enlarged for an easy understanding of fluctuations on ordinate.

Figure 11:
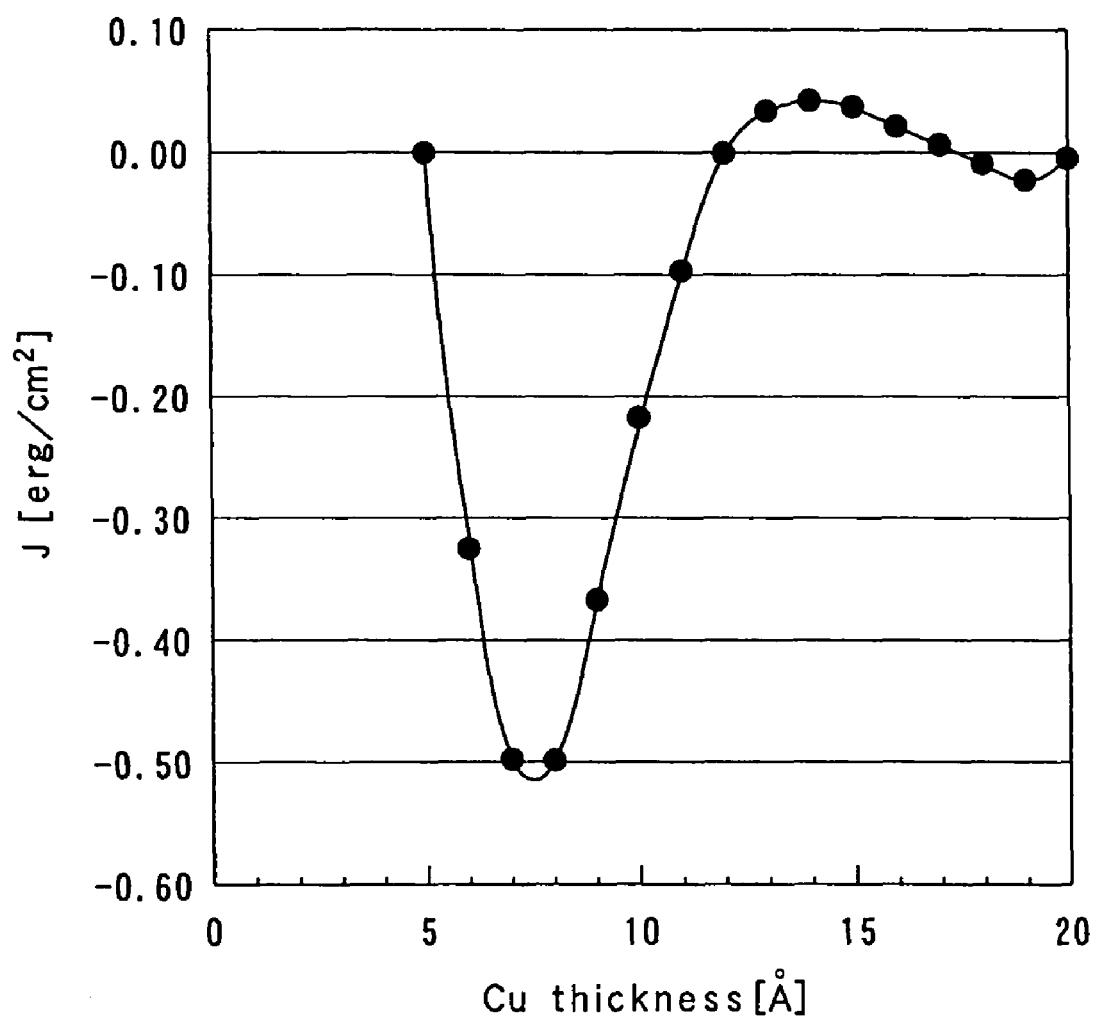
FIG. 11 is a graph indicative of the Cu thickness t (Å) vs. the exchange coupled magnetic filed strength J (erg/cm$^2$).

In the graphs of FIGS. 10 and 11, when the value of the exchange coupled magnetic field strength J (erg/cm$^2$) is plus (+), there is the so-called ferromagnetic coupling taking place (where magnetic coupling occurs with magnetizations in the same direction). In contrast, when the value of the exchange coupled magnetic field strength J (erg/cm$^2$) is minus (−), there is the antiferromagnetic coupling taking place (where magnetic coupling occurs with magnetizations in the same direction).

The absolute value |J| of the exchange coupled magnetic filed strength J (erg/cm$^2$) is indicative of the absolute quantity of the coupled strength itself.

Preferably, the exchange coupling transfer layer 101, 105 should be designed such that the absolute value |J| of the exchange coupled magnetic field strength J (erg/cm$^2$) is greater than 0.2 (erg/cm$^2$): |J|>0.2 (erg/cm$^2$). As the absolute value |J| of the exchange coupled magnetic field strength J (erg/cm$^2$) is below 0.2 (erg/cm$^2$), it causes the magnetizations 111a and 115b of the gap adjustment layers 111 and 115 to fluctuate under the influences of a magnetic field from the medium, resulting in inconvenience that they may otherwise function as shields.

With these considerations in mind, it is herein desired that (1) when Cu is used for the exchange coupling transfer layer 101, 105, the thickness of Cu be set in the range of 6 to 10 Å, and (2) when Ru is used for the exchange coupling transfer layer 101, 105, the thickness of Ru be set in the ranges of 4 to 9 Å and 16 to 20 Å, as can be seen from the graph of FIG. 10 or FIG. 11.

In contrast, the exchange coupling adjustment layer 121, 125 is preferably designed such that the absolute value |J| of the exchange coupled magnetic field strength J (erg/cm$^2$) is greater than 0.02 (erg/cm$^2$) but less than 0.6 (erg/cm$^2$): 0.02<|J|<0.6 (erg/cm$^2$). As the absolute value |J| of the exchange coupled magnetic field strength J (erg/cm$^2$) is below 0.02 (erg/cm$^2$), it causes the magnetization state of the first and second ferromagnetic layers 130 and 150 functioning as the free layers to come to have a multiple domain structure, resulting in inconvenience of giving rise to Barkhausen noises. As the absolute value |J| of the exchange coupled magnetic field strength J (erg/cm$^2$) is greater than 0.6 (erg/cm$^2$), it causes the magnetizations of the first and second ferromagnetic layers 130 and 150 functioning as the free layers to be incapable of freely responding to a signal magnetic field from the medium, resulting in inconvenience that may otherwise lead to sensitivity drops.

With these considerations in mind, it is herein desired that (1) when Cu is used for the exchange coupling adjustment layer 121, 125, the thickness of Cu be set in the range of 13 to 16 Å, and (2) when Ru is used for the exchange coupling adjustment layer 121, 125, the thickness of Ru be set in the range of 9.5 to 20 Å, as can be seen from the graph of FIG. 10 or FIG. 11.

It is noted that even when Rh, Ir, Cr, Ag, Au, Pt, and Pd is used as the material to form the exchange coupling transfer layer 101, 105 and the exchange coupling adjustment layer 121, 125, the thickness of one each may be set as is the case with Ru, and Cu.

Explanation of the Sensor Area Comprising the First Ferro-Magnetic Layer 130, the Nonmagnetic Intermediate Layer 140, and the Second Ferromagnetic Layer 150

As already referred to, the sensor area is defined by the multilayer structure comprising the first ferromagnetic layer 130, the nonmagnetic intermediate layer 140 and the second ferromagnetic layer 150, and the total thickness of that multilayer structure is about 10 to 20 nm. Of these layers, the first 130 and the second ferromagnetic layer 150 function as the free layers, one each having the direction of magnetization changing under the influences of an externally applied magnetic field.

For instance, the first 130, and the second ferromagnetic layer 150 is made of a material such as NiFe, CoFe, CoFeB, CoFeNi, Co$_2$MnSi, Co$_2$MnGe, and FeO$_x$ (the oxide of Fe), and has a thickness of about 0.5 to 8 nm.

The nonmagnetic intermediate layer 140 is the film essentially required to let the MR effect show up, and is typically made of Cu, Au, Ag, Zn, Ga, TiO$_x$, ZnO, InO, SnO, GaN, ITO (indium tin oxide), Al$_2$O$_3$, and MgO. In a preferable embodiment, the nonmagnetic intermediate layer 140 is formed of a multilayer structure comprising two or more layers, for instance, a triple-layer structure film of Cu/ZnO/Cu. A triple-layer structure film of Cu/ZnO/Zn with Cu replaced by Zn is also preferable because of boosted-up output.

The nonmagnetic intermediate layer 140 has a thickness of about 0.5 to 5 nm.

(Explanation of One Modification to the Magnetoresistive Device)

FIGS. 5, 6 and 7 are illustrative, as in FIG. 3, of modifications to the construction of the magnetoresistive unit 8.

Commonly in any case, the first ferromagnetic layer 130 and the second ferromagnetic layer 150, one each functioning as the free layer, receive such action that there is an antiparallel magnetization state created, where their magnetizations are in opposite directions, under the influences of magnetic actions from the front frame-constituting portions 31 and 51 for the first shield layer 3 and the second shield layer 5, respectively. What is different is whether antiferromagnetic coupling or ferromagnetic coupling is to be used depending on the material and thickness specifications of the exchange coupling transfer layer 101, 105 and the exchange coupling adjustment layer 121, 125.

Figure 8:
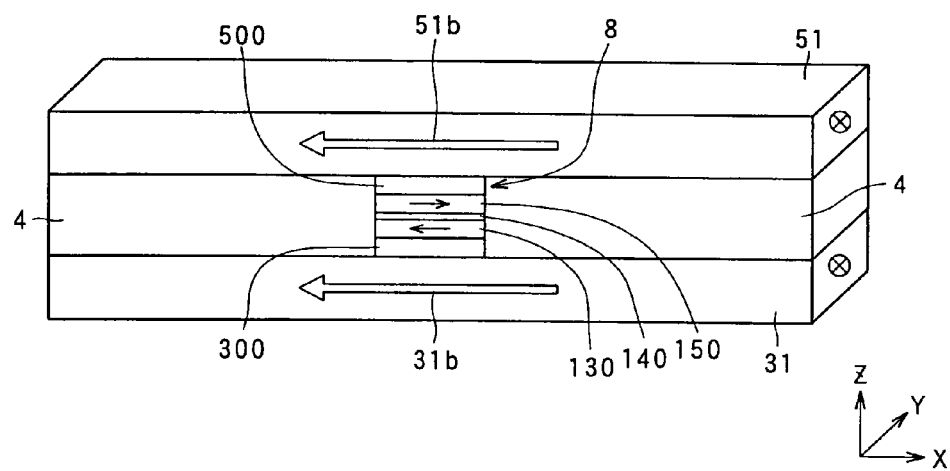
FIG. 8 is illustrative in perspective, as in FIG. 2, of the magnetoresistive device according to another embodiment of the invention, as viewed from the ABS (air bearing surface).
Figure 9:
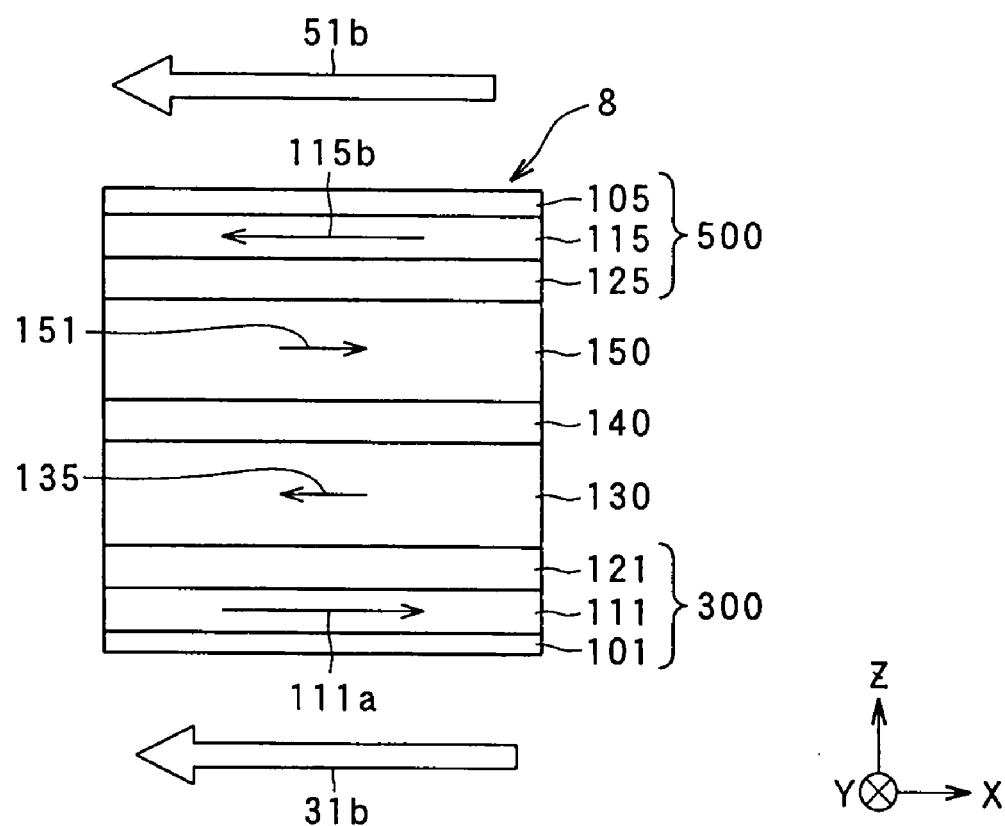
FIG. 9 is an enlarged schematic view of the magnetoresistive unit in the magnetoresistive device of FIG. 8 including a sensor area.

FIG. 8 is a perspective view of the magnetoresistive device according to another embodiment of the invention, as viewed from the ABS (air bearing surface). FIG. 9 is an enlarged schematic view of the magnetoresistive unit of the magnetoresistive device of FIG. 8 including the sensor area.

In the embodiment shown in FIG. 8, the front frame-constituting portion 31 for the first shield layer 3 has its magnetization fixed in the minus width direction (−X direction) from the right to the left side of the paper. Likewise, the front frame-constituting portion 51 for the second shield layer 5 has its magnetization fixed in the minus width direction (−X direction) from the right to the left side of the paper, too.

In this modified embodiment, too, the first 130 and the second ferromagnetic layer 150, one each functioning as the free layer, receive such action that there is an antiparallel magnetization state created, where their magnetizations are in opposite directions, under the influences of magnetic actions from the front frame-constituting portions 31 and 51 for the first shield layer 3 and the second shield layer 5, respectively. The exchange coupling transfer layer 101, 105, and the exchange coupling adjustment layer 121, 125 can make use of either antiferromagnetic coupling or ferromagnetic coupling depending on what material is used and what thickness it is set at. Such modifications to the construction of the magnetoresistive unit 8 as shown in FIGS. 5, 6 and 7 may be applied to another embodiment of FIG. 9.

Figure 12:
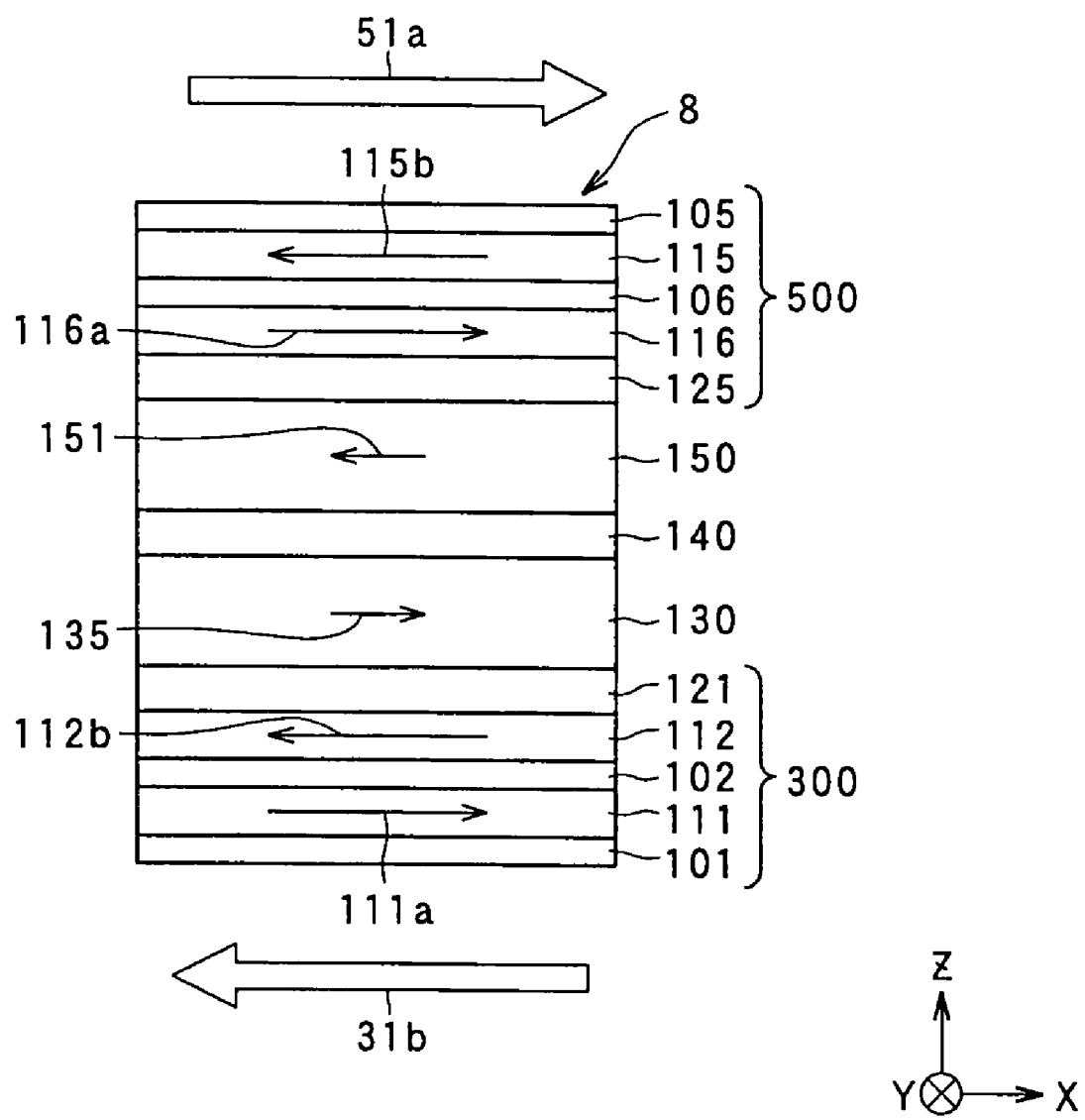
FIG. 12 is illustrative in section of a further modification to the construction of the magnetoresistive unit.

FIG. 12 is illustrative of another modification to the magnetoresistive unit 8. This modification is different from the aforesaid magnetoresistive unit 8 in terms of the construction of the first exchange coupling function gap layer 300, and the construction of the second exchange coupling function gap layer 500. That is, in FIG. 12, the first exchange coupling function gap layer 300 comprises, in order from the side of the front frame-constituting portion 31 for the first shield layer 3, an exchange coupling transfer layer 101, a gap adjustment layer 111, an exchange coupling transfer layer 102, a gap adjustment layer 112, and an exchange coupling adjustment layer 121. On the other hand, the second exchange coupling function gap layer 500 comprises, in order from the side of the front frame-constituting portion 51 for the second shield layer 5, an exchange coupling transfer layer 105, a gap adjustment layer 115, an exchange coupling transfer layer 106, a gap adjustment layer 116, and an exchange coupling adjustment layer 125. In this embodiment, too, the construction of each of the layers described as the exchange coupling transfer layer, gap adjustment layer and exchange coupling adjustment layer is the same as that of each of the exchange coupling transfer layer, gap adjustment layer and exchange coupling adjustment layer shown in FIGS. 3 and 5-7.

In the embodiment shown in FIG. 12, by (1) making strong antiferromagnetic coupling between two ferromagnetic layers, say, the gap adjustment layers 111 and 112 while both have the matching quantity of magnetization Mst, and (2) making strong antiferromagnetic coupling between two ferromagnetic layers, say, the gap adjustment layers 115 and 116 while both have the matching quantity of magnetization Mst, it is possible to reduce responses to the external magnetic field down to zero, thereby achieving more preferable advantages. Even when the coupling strength of the exchange coupling transfer layer is relatively weak, it is possible to make sure it has also a gap layer function. In the construction shown in FIG. 12, it is noted that the third peak of Ru may be used as the exchange coupling adjustment layer.

[Explanation of Another Modification to the Magnetoresistive Device]

Figure 15:
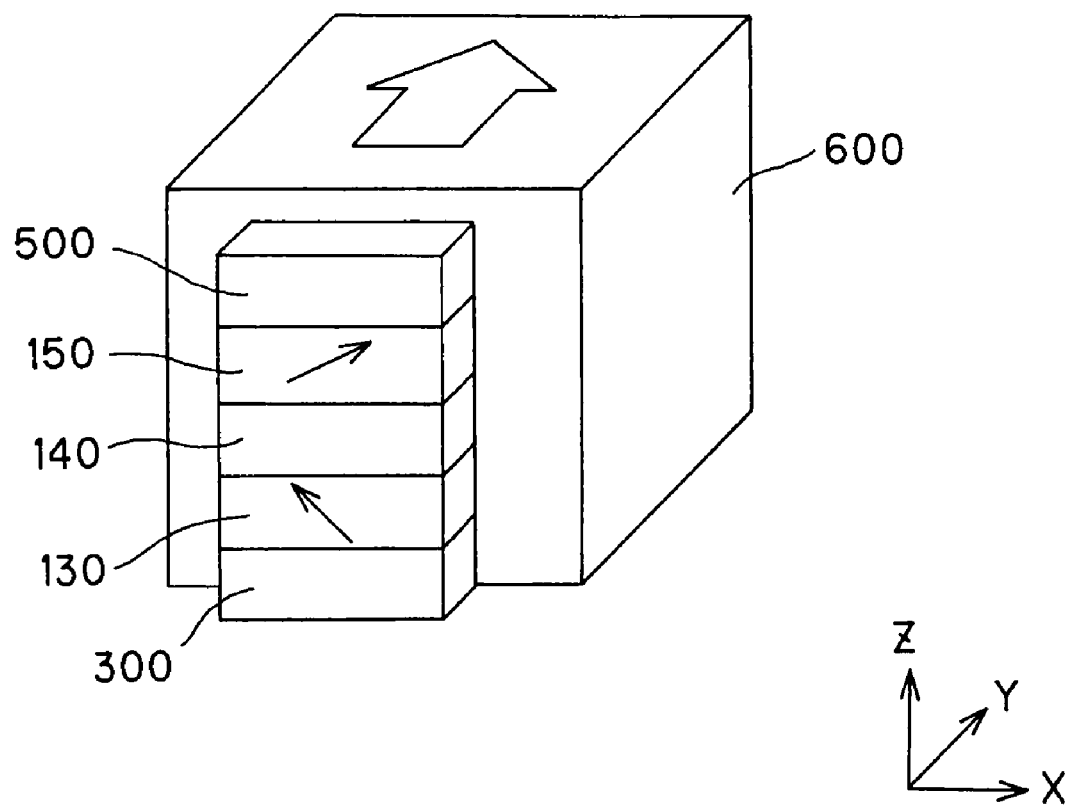
FIG. 15 is a model illustrative in perspective of a device bias magnetic field-applying means (device bias-applying layer) located at the rear (depth side: Y-direction) of the first, and the second ferromagnetic layer.

The structure or embodiment of such a magnetoresistive device as shown in FIG. 1 also performs better in that the bias magnetic field-applying layer 154, 156 (FIG. 1) and a device bias magnetic field-applying means (device bias-applying layer) 600 to be described later (FIG. 15) can be magnetized integrally and simultaneously.

Figure 13:
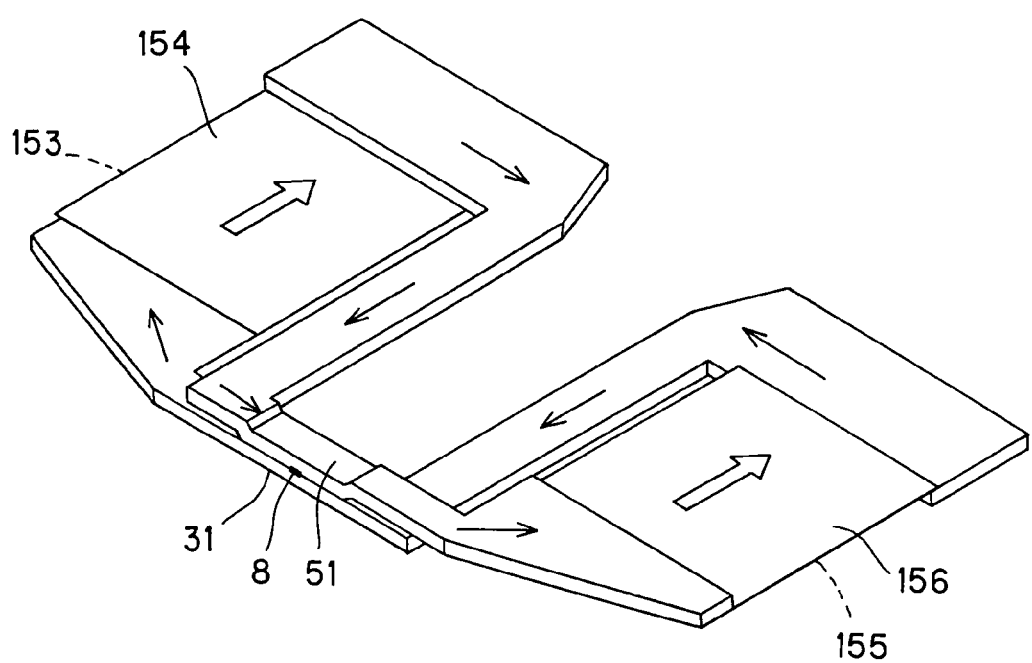
FIG. 13 is illustrative in perspective of the magnetoresistive device according to a further embodiment of the invention, as viewed from the ABS (air bearing surface).

Further, the two shield layers or the first 3 and the second shield layer 5 shown in FIG. 1 may be formed as an integral piece with a continual or uninterrupted magnetic path, as shown in FIG. 13, rather than as separate members. This embodiment is encompassed in the scope of the invention of this application, too.

Two such first 3 or second shield layers 5 as shown in FIG. 1 may be located above and below. In this case, when the two bias magnetic field-applying layers are magnetized in the same Y-direction, the front frame-constituting portions 31, 51 for the first 3 and the second shield layer 5 are placed in magnetic field directions 31*b*, 51*b*, as shown in FIG. 8.

Figure 21:
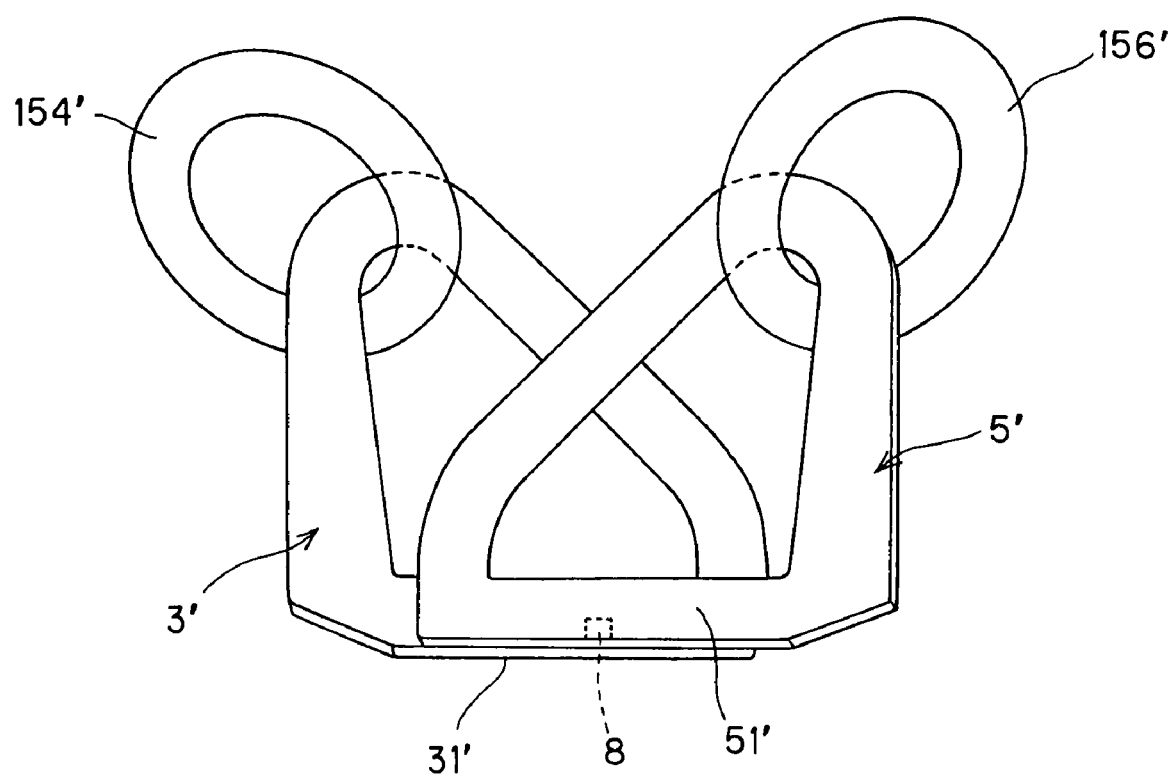
FIG. 21 is illustrative in perspective of the magnetoresistive device in another embodiment of the invention, as viewed from the ABS (air bearing surface) direction.

FIG. 21 is illustrative of a sort of an embodiment rather than a modification, wherein there is a change in the means for applying magnetization to the shields. Specifically, FIG. 21 is a perspective view of the magnetoresistive device according to another embodiment of the invention, as viewed from the ABS (air bearing surface) direction. The framework for the first 3', and the second shield layer 5' shown in FIG. 21 comprises a front frame-constituting portion 31', 51' located on the side opposite to the medium opposite plane in front and near where the magnetoresistive unit is positioned. Further, a coil 154', 156' is wound around a part of the framework for the aforesaid first, and the aforesaid second shield layer so that by a magnetic flux generated by passing currents through that coil 154', 156', the magnetization of the front frame-constituting portion 31', 51' for the aforesaid first, and second shield layer is turned into a single domain and the direction of that magnetization is controlled. Note here that by an appropriate choice of the direction of currents passing through the coil 154', 156' (current application directioin), the direction of magnetization of the front frame-constituting portion 31', 51' for the first, and the second shield layer may be changed.

[Explanation of the Operation of the Magnetoresistive Device of Detecting the External Magnetic Field]

Figure 14A:
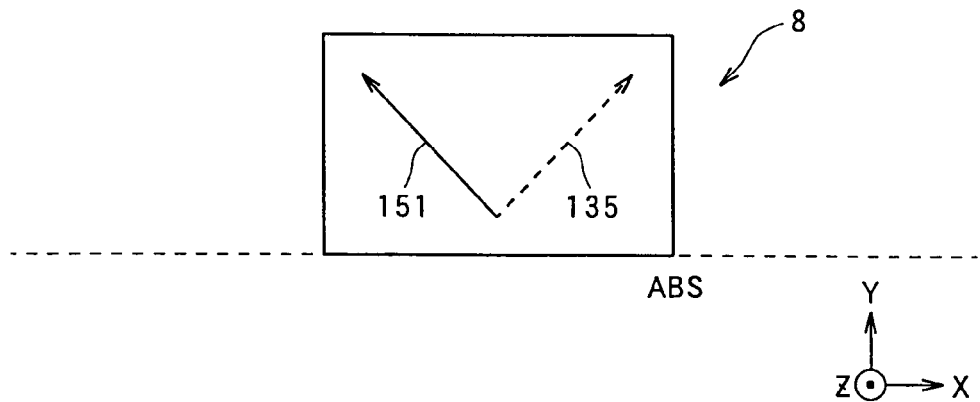
FIGS. 14A, 14B and 14C are models indicative of external magnetic field-depending changes in the state of magnetization where changes in the magnetoresistive of the inventive magnetoresistive device are obtainable.

The operation of the magnetoresistive device of the invention of detecting an external magnetic field is now explained with reference to FIGS. 14A, 14B and 14C.

Before the application of a bias magnetic field for placing magnetizations in the orthogonal directions, the first 130 and the second ferromagnetic layer 150 are each in an antiparallel magnetization state where their magnetizations are in opposite directions under the influences of the magnetic actions of the front frame-constituting portions 31 and 51 for the first 3 and the second shield layer 5, respectively.

Usually, through a bias magnetic field-applying means (device bias-applying layer) 600 such as a hard magnet located at the rear (the depth side: Y-direction) of the first 130 and the second ferromagnetic layer 150, a bias magnetic field is applied to the first 130 and the second ferromagnetic layer 150 so that the magnetizations 135 and 151 of the first 130 and the second ferromagnetic layer 150 are placed in substantially orthogonal directions, creating such a state as shown in FIG. 14A. This state defines the initial state of the magnetoresistive device (the magnetoresistive unit 8).

Figure 14B:
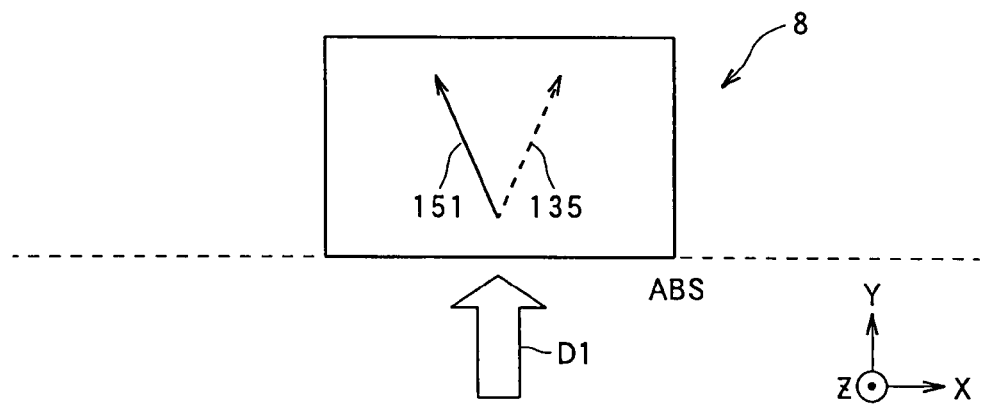

As an external magnetic field D1 flowing from the ABS into the device side is detected as shown in FIG. 14B, both the magnetizations 135 and 151 of the first 130 and the second ferromagnetic layer 150 tend to lie in the same direction so that the resistance of the device grows low.

Figure 14C:
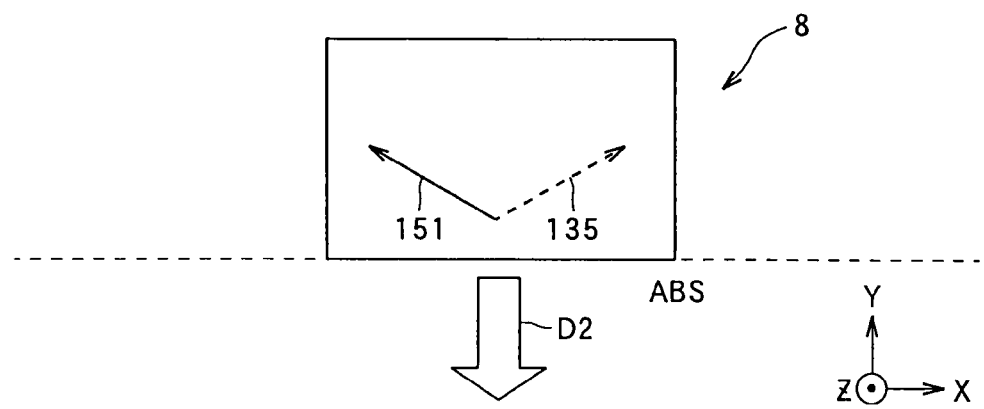

On the other hand, as an external magnetic field D2 in a direction away from the ABS is detected as shown in FIG. 14C, the magnetizations 135 and 151 of the first 130 and the second ferromagnetic layer 150 tend to lie in opposite directions so that the resistance of the device grows high.

By measuring such a series of resistance changes with the external magnetic field, it is possible to detect the external magnetic field.

It is here noted that by letting the magnetoresistive device have such structure as shown in FIG. 1, the bias magnetic field-applying layers 154, 156 (FIG. 1) and the bias magnetic field-applying means (device bias-applying layer) 600 (FIG. 15) can be magnetized integrally and simultaneously in the same magnetization direction (Y-direction) so that the magnetization step can be simplified with improvements in the reliability of magnetization.

[Explanation of the Whole Structure of the Thin-film Magnetic Head]

Figure 16:
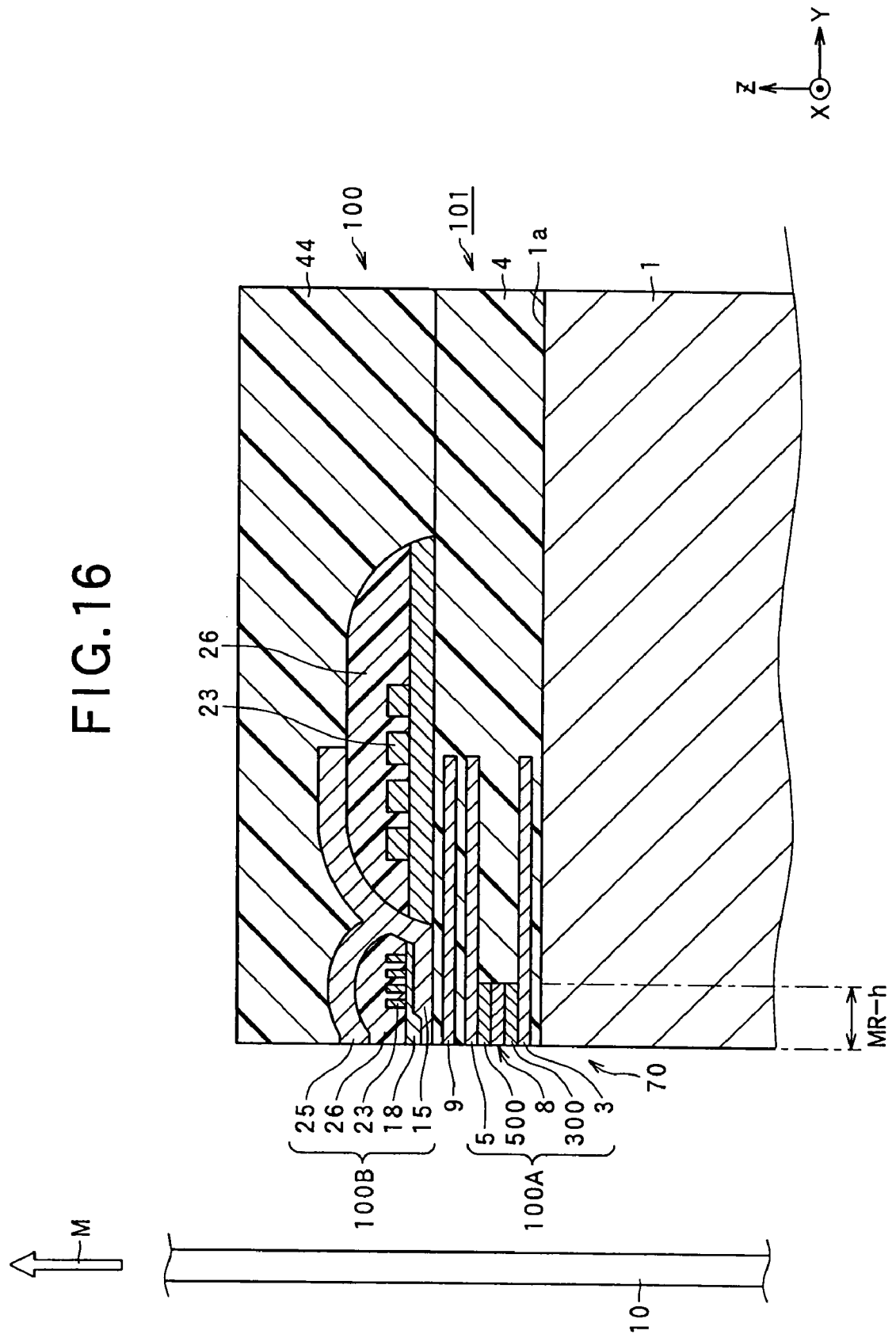
FIG. 16 is illustrative in section of the thin-film magnetic head parallel with the so-called air bearing surface (ABS).

FIG. 16 is illustrative in section (section in the Y-Z plane) of a thin-film magnetic head parallel with the so-called air bearing surface (ABS).

A thin-film magnetic head 100 shown in FIG. 16 is used on a magnetic recording system such as a hard disk drive for the purpose of applying magnetic processing to a recording medium 10 like a hard disk moving in a medium travel direction M.

The thin-film magnetic head 100 illustrated in the drawing is a composite type head capable of implementing both recording and reproducing as magnetic processing. The structure comprises, as shown in FIG. 16, a slider substrate 1 made of a ceramic material such as AlTiC ($Al_2O_3 \cdot TiC$), and a magnetic head unit 101 formed on the slider substrate 1.

The magnetic head unit 101 has a multilayer structure comprising a reproducing head portion 100A adapted to implement reproducing process for magnetic information recorded by making use of the magneto-resistive (MR) effect and a shield type recording head portion 100B adapted to implement a perpendicular recording type recording processing.

A detailed account is now given below.

A first shield layer 3 and a second shield layer 5 are each a planar layer formed in such a way as to be almost parallel with the side 1a of the slider substrate 1, forming a part of the ABS that is a medium opposite plane 70.

A magnetoresistive unit 8 is disposed in such a way as to be held between the first 3 and the second shield layer 5, forming a part of the medium opposite plane 70. And a height in the perpendicular direction (Y-direction) to the medium opposite plane 70 defines an MR height (MR-h).

For instance, the first 3 and the second shield layer 5 are each formed by pattern plating inclusive of frame plating or the like. Although not clearly shown in the drawing, the first 1 and the second shield layer 5 must be set up in such a way as to have the aforesaid advantages of the invention.

The magnetoresistive unit 8 is a multilayer film formed in such a way as to be almost parallel with the side 1a of the slider substrate 1, forming a part of the medium opposite surface 70.

The magnetoresistive unit 8 is a multilayer film of the current-perpendicular-to-plane type (CPP type) with a sense current passing in the direction perpendicular to the staking plane, as previously mentioned.

Figure 17:
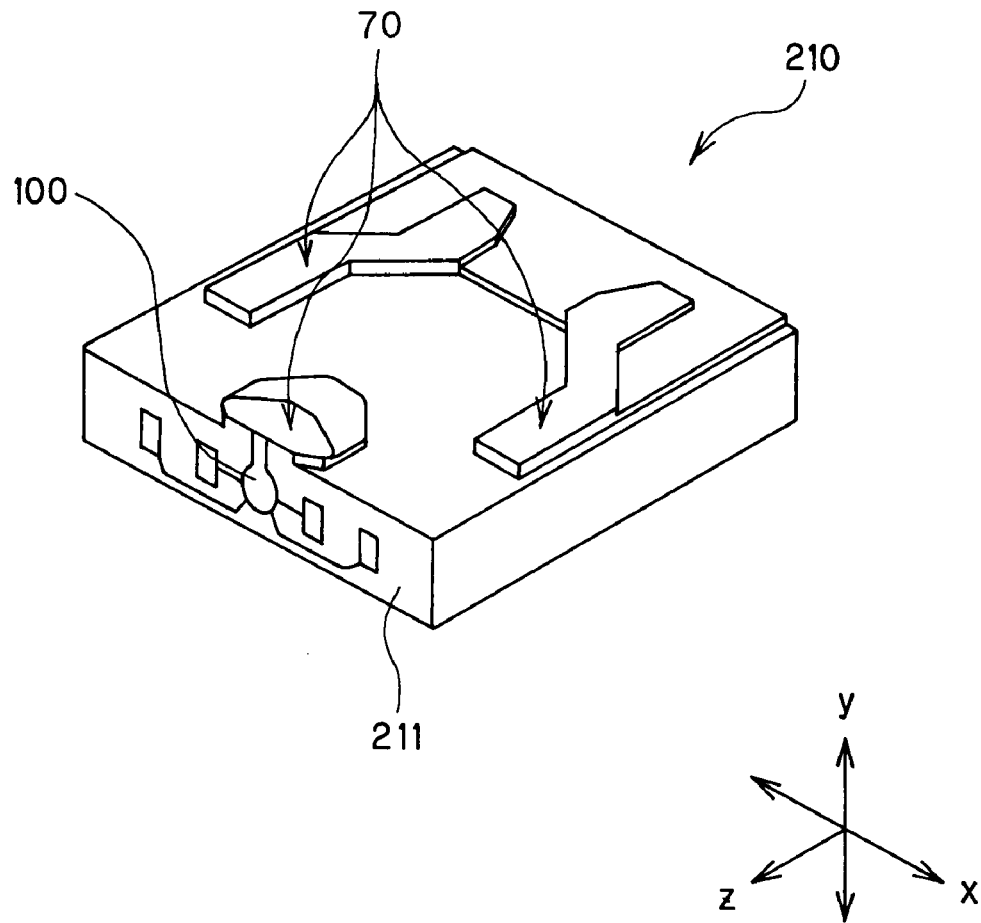
FIG. 17 is illustrative in perspective of the slider included in the head gimbal assembly according to one embodiment of the invention.

As shown in FIG. 17, between the second shield layer 5 and the recording head portion 100B there is an inter-device shield layer 9 formed that is made of a similar material as the second shield layer 5 is.

The inter-device shield layer 9 keeps the magnetoresistive unit 8 functioning as a sensor out of a magnetic field occurring from the recording head 100B, taking a role in prevention of extraneous noises upon reading. Between the inter-device shield layer 9 and the recording head portion 100B there may also be a backing coil portion formed. The backing coil portion is to generate a magnetic flux that cancels out a magnetic flux loop that is generated from the recording head portion 100B, passing through the upper and lower electrode layers of the magnetoresistive unit 8: this backing coil portion works to hold back the wide adjacent track erasure (WATE) phenomenon that is unwanted writing or erasure operation with the magnetic disk.

At a gap between the first and second shield layers 3 and 5 on the side of the magnetoresistive unit 8 that faces away from the medium opposite plane 70, at the rear of the first and second shield layers 3, 5 and the inter-shield shield layer 9 that face away from the medium opposite plane 70, at a gap between the first shield layer 3 and the slider substrate 1, and at a gap between the inter-device shield layer 9 and the recording head portion 100B, there are insulating layers 4 and 44 formed, one each made of alumina or the like.

The recording head portion 100B is preferably constructed for the purpose of perpendicular magnetic recording, and comprises a main magnetic pole layer 15, a gap layer 18, a coil insulating layer 26, a coil layer 23 and an auxiliary magnetic pole layer 25, as shown in FIG. 16. Of course, the recording head portion 100B may be changed from the perpendicular recording type to a longitudinal recording type.

The main magnetic pole layer 15 is set up as a magnetic guide path for guiding a magnetic flux induced by the coil layer 23 to the recording layer of a magnetic recording medium 10 with information being to be written on it while converging that magnetic flux. At the end of the main magnetic pole layer 15 here that is on the medium opposite plane 70 side, the width in the track width direction (along the X-axis of FIG. 16) and thickness in the stacking direction (along the Z-axis of FIG. 16) of the main magnetic pole layer 15 should preferably be less than those of the rest. Consequently, it is possible to generate a fine yet strong writing magnetic flux well fit for high recording densities.

The end on the medium opposite plane 70 side of the auxiliary magnetic pole layer 25 magnetically coupled to the main magnetic pole layer 15 forms a trailing shield portion having a layer section wider than that of the rest of the auxiliary magnetic pole layer 25. As shown in FIG. 16, the auxiliary magnetic pole layer 25 is opposed to the end of the main magnetic pole layer 15 on the medium opposite plane 70 side while the gap layer 18 made of an insulating material such as alumina and the coil insulating layer 26 are interposed between them.

By the provision of such auxiliary magnetic pole layer 25, it is possible to make steeper a magnetic field gradient between the auxiliary magnetic pole layer 25 and the main magnetic pole layer 15 near the medium opposite plane 70. Consequently, jitters of signal outputs diminish, resulting in the ability to minimize error rates upon reading.

The auxiliary magnetic pole layer 25, for instance, is formed at a thickness of, e.g., about 0.5 to 5 µm using frame plating, sputtering or the like. The material used may be an alloy comprising two or three of, for instance, Ni, Fe and Co, or comprising them as a main component with the addition of given elements to it.

The gap layer 18 is formed in such a way as to space the coil layer 23 away from the main magnetic pole layer 15. The gap layer 18 is constructed from $Al_2O_3$, DLC (diamond-like carbon) or the like having a thickness of, for instance, about 0.01 to 0.5 µm, and formed using, for instance, sputtering, CVD or the like.

[Explanation of the Head Gimbal Assembly and the Hard Disk System]

One each example of the head gimbal assembly and the hard disk system, used with the foregoing thin-film head mounted on it, is now explained.

A slider 210 included in the head gimbal assembly is first explained with reference to FIG. 17. In the hard disk system, the slider 210 is located in such a way as to face a hard disk that is a rotationally driven disk-form recording medium. This slider 210 primarily comprises a substrate 211 built up of a substrate and an overcoat.

The substrate 211 is in a generally hexahedral shape. Of the six surfaces of the substrate 211, one surface is in opposition to the hard disk. On that one surface there is a medium opposite plane 30 formed.

As the hard disk rotates in the z-direction in FIG. 17, it causes an air flow passing between the hard disk and the slider 210 to induce lift relative to the slider 210 in the downward y-direction in FIG. 17. This lift in turn causes the slider 210 to levitate over the surface of the hard disk. Note here that the x direction in FIG. 17 traverses tracks on the hard disk.

Near the end of the slider 210 on an air exit side (the left lower end in FIG. 17), there is a thin-film magnetic head formed according to the embodiment here.

A head gimbal assembly 220 according to this embodiment is now explained with reference to FIG. 18. The head gimbal assembly 220 comprises a slider 210 and a suspension 221 adapted to resiliently support that slider 210. The suspension 221 comprises a leaf spring-form load beam 222 made of typically stainless steel, a flexure 223 attached to one end of the load beam 222 and having the slider 210 joined to it for giving a suitable degree of flexibility to the slider 210, and a base plate 224 attached to the other end of the load beam 222.

The base plate 224 is adapted to be attached to an arm 230 of an actuator for moving the slider 210 in the track traverse direction x of the hard disk 262. The actuator comprises the arm 230 and a voice coil motor for driving that arm 230. At a portion of the flexure 223 having the slider 210 attached to it, there is a gimbal portion provided for keeping the posture of the slider 210 constant.

The head gimbal assembly 220 is attached to the arm 230 of the actuator. The head gimbal assembly 220 attached to one arm 230 is called a head arm assembly, whereas the head gimbal assembly 220 attached to a carriage at its plurality of arms is referred to as a head stack assembly.

Figure 18:
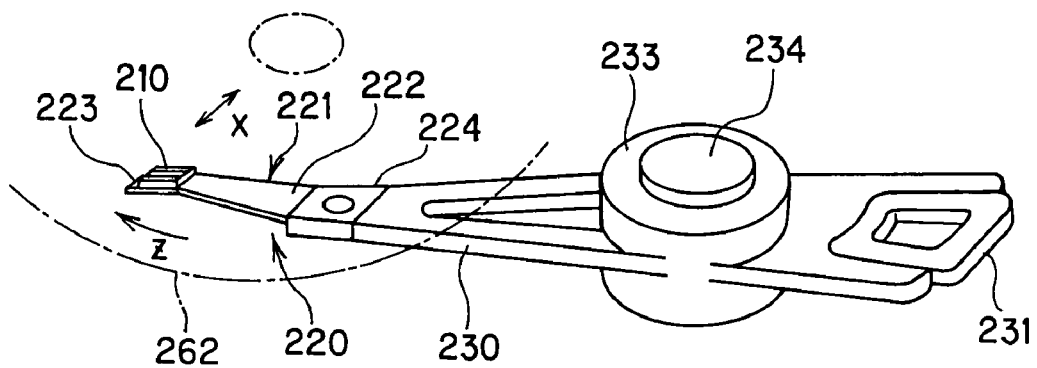
FIG. 18 is illustrative in perspective of the head arm assembly comprising the head gimbal assembly according to one embodiment of the invention.

FIG. 18 illustrates one example of the head arm assembly, wherein the head gimbal assembly 220 is attached to one end of the arm 230. To the other end of the arm 230, a coil 231 forming a part of the voice coil motor is attached. Halfway across the arm 230, there is a bearing portion 233 attached to a shaft 234 adapted to support the arm 230 in a pivotal fashion.

One each example of the head stack assembly and the hard disk system according to the embodiment here are now explained with reference to FIGS. 19 and 20.

Figure 19:
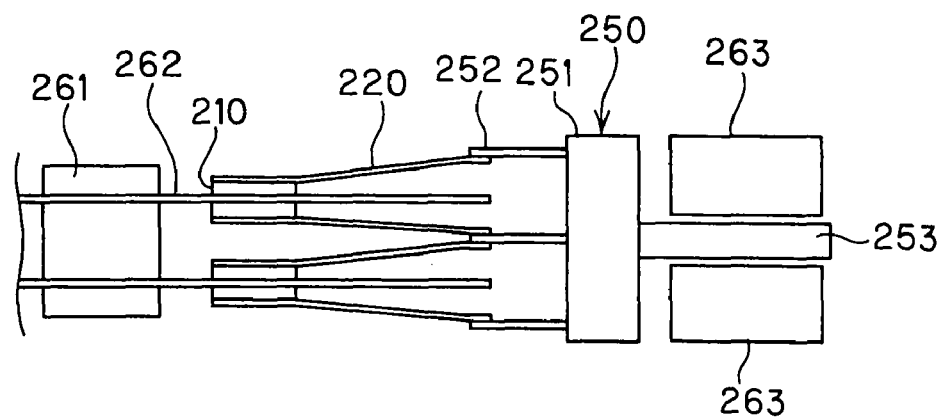
FIG. 19 is illustrative of part of the hard disk system according to one embodiment of the invention.
Figure 20:
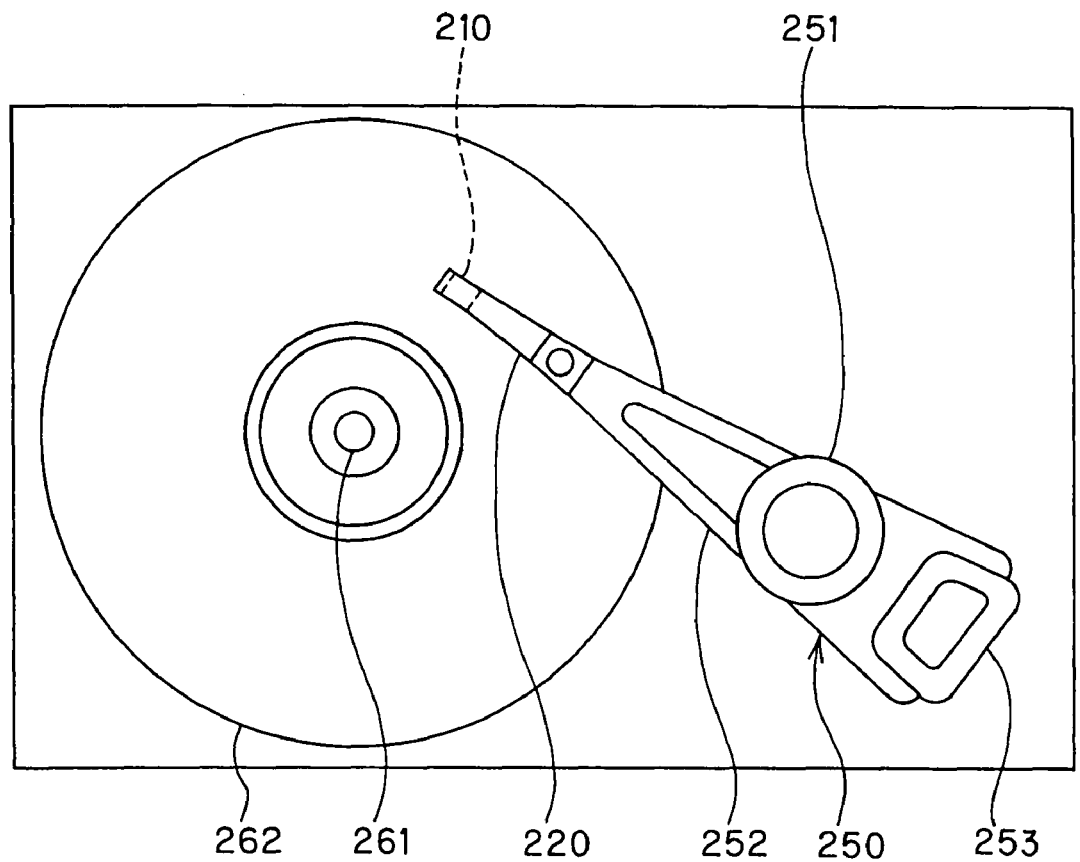
FIG. 20 is a plan view of the hard disk system according to one embodiment of the invention.

FIG. 19 is illustrative of part of the hard disk system, and FIG. 20 is a plan view of the hard disk system.

A head stack assembly 250 comprises a carriage 251 having a plurality of arms 252. The plurality of arms 252 are provided with a plurality of the head gimbal assemblies 220 such that they line up perpendicularly at an interval. On the side of the carriage 251 that faces away from the arms 252, there is a coil 253 attached, which coil becomes a part of the voice coil motor. The head stack assembly 250 is incorporated in the hard disk system.

The hard disk system comprises a plurality of hard disks 262 attached to a spindle motor 261. For each hard disk 262, two sliders 210 are located such that they are opposite to each other with the hard disk 262 held between them. The voice coil motor has also permanent magnets 263 located at opposite positions with the coil 253 of the head stack assembly 250 held between them.

The head stack assembly 250 except the slider 210 and the actuator correspond to the positioning device here which is operable to support the slider 210 and position it relative to the hard disk 262.

With the hard disk system here, the actuator is actuated to move the slider 210 in the track traverse direction of the hard disk 262, thereby positioning the slider 210 with respect to the hard disk 262. The thin-film magnetic head incorporated in the slider 210 works such that information is recorded by a recording head in the hard disk 262, and the information recorded in the hard disk 262 is played back by a reproducing head.

The head gimbal assembly and the hard disk system here have pretty much the same action as the thin-film magnetic head according to the foregoing embodiments.

While the embodiment here has been described with reference to the thin-film magnetic head of the structure wherein the reproducing head portion is located on the substrate side and the perpendicular recording head portion is stacked on the reproducing head, it is contemplated that that order of stacking could be reversed. When the thin-film magnetic head here is used as a read-only head, the recording head could be removed from it.

SPECIFIC EXPERIMENTS

The magnetoresistive device of the invention is now explained in further details with reference to some specific experiments.

Experimental Example 1

An experimental sample (the sample of Example 1) for the magnetoresistive device of such construction as shown in FIGS. 1 and 2 was prepared.

That is, as set out in Table 1 given below, the magnetoresistive unit 8 of such multilayer construction as set out in Table 1 was formed on the front frame-constituting portion 31 for the first shield layer 3 made of NiFe and having a width of 30 μm (the X-axis direction size), a length of 5 μm (the Y-axis direction size) and a thickness of 1 μm (the Z-axis direction size). Then, there was the front frame-constituting portion 51 for the second shield layer 5 formed on that magnetoresistive unit 8, which was made of NiFe and had a width of 30 μm (the X-axis direction size), a length of 5 μm (the Y-axis direction size) and a thickness of 1 μm (the Z-axis direction size). Both sides of the magnetoresistive unit 8 were insulated off by alumina.

The first 3 and the second shield layer 5 had the front frame-constituting portions 31 and 51 of the aforesaid sizes, and were configured and located as shown in FIG. 1.

The side frame-constituting portion 35 for the first shield layer 3 (having an X-direction width of $Y_1=Y_3=25$ μm) partially comprised a combination of the first nonmagnetic gap layer 153 with the second bias magnetic field-applying layer 154, and the side frame-constituting portion 55 for the second shield layer 5 partially comprised a combination of the second nonmagnetic gap layer 155 with the second bias magnetic field-applying layer 156.

Formed of an alumina material having an X-direction width of 25 μm, a Y-direction length of 25 μm and a Z-direction thickness of 1 μm, the first 153 and the second bias magnetic field-applying layer 156 were each buried and formed in such a way as to interrupt the soft magnetic shield.

The first 154 and the second bias magnetic field-applying layer 156 were formed on the first 153 and the second nonmagnetic gap layer 155, respectively, with the same X-Y sizes. The Z-direction thickness was 0.2 μm. The material was CoCrPt. Film formation was implemented by sputtering. Note here that between the nonmagnetic gap layer 155 (153) and the bias magnetic field-applying layer 156 (154), an underlay layer made of Ta (thickness: 3 nm) and a buffer layer made of CrTi (thickness: 5 nm) were interposed in order from the side of the nonmagnetic gap layer 155 (153).

By magnetic fields from the first 154 and the second bias magnetic field-applying layer 156, the first 3 and the second shield layer 5 as well as the front frame-constituting portions 31 and 51 were each allowed to have a single domain structure, and the magnetizations of the respective front frame-constituting portions 31 and 51 were in antiparallel directions, as shown in FIGS. 1 and 2.

In the construction enumerated in Table 1, the magnetization 31b of the front frame-constituting portion 31 for the first shield layer 3 is antiferromagnetically coupled to the magnetization 111a of the gap adjustment layer 111, and the magnetization 111a of the gap adjustment layer 111 is antiferromagnetically coupled to the magnetization 135 of the first ferromagnetic layer 130, as shown in FIG. 3, and the magnetization 51a of the front frame-constituting portion 51 for the second shield layer 5 is antiferromagnetically coupled to the 115b of the gap adjustment layer 115, and the magnetization 115b of the gap adjustment layer 115 is antiferromagnetically coupled to the magnetization 151 of the second ferromagnetic layer 150.

Using the thus formed sample of Example 1 for the magnetoresistive device, a signal magnetic field was detected from a medium corresponding to −400 Oe to 400 Oe. As a result, it has been confirmed that viable magnetic resistance changes are obtainable.

Further, a stress magnetic field of 500 Oe was applied to the sample of Example 1 for the magnetoresistive device to measure output fluctuations before and after the application of the stress magnetic field. It has thus been found that the incidence of defective devices is very low, and the magnetoresistive device of the sample of Example 1 is strikingly improved in terms of magnetic field resistance.

TABLE 1

| Multilayer Structure | | | Layer Material | Thickness (nm) |
|---|---|---|---|---|
| Front Frame-Constituting Portion (51) for the Second Shield Layer | | | NiFe | 1000 |
| Magnetoresistive Unit (8) | Second Exchange Coupling Gap Layer (500) | Exchange Coupling Transfer Layer (105) | Ru | 0.8 |
| | | Gap Adjustment Layer (115) | CoFe | 4.0 |
| | | Exchange Coupling Adjustment Layer (125) | Cu | 0.9 |
| | Sensor Area | Second Ferromagnetic Layer (150) | CoFe | 3.0 |
| | | Nonmagnetic Intermediate Layer (140) | Cu | 0.5 |
| | | | ZnO | 1.8 |
| | | | Cu | 0.5 |
| | | First Ferromagnetic Layer (130) | CoFe | 3.0 |
| | First Exchange Coupling Gap Layer (300) | Exchange Coupling Transfer Layer (121) | Cu | 0.9 |
| | | Gap Adjustment Layer (111) | CoFe | 4.0 |
| | | Exchange Coupling Adjustment Layer (101) | Ru | 0.8 |
| Front Frame-Constituting Portion (31) for the First Shield Layer | | | NiFe | 1000 |

Experimental Example 2

In the Example 1 sample of the aforesaid Experimental Example 1, the material of which the non-magnetic intermediate layer 140 forming the sensor area was made was changed from the triple-layer structure of Cu (of 0.5 nm in thickness)/ZnO (of 1.8 nm in thickness)/Cu (of 0.5 nm in thickness) to MgO (of 0.8 nm in thickness).

In otherwise the same way as in the aforesaid Example 1, an experimental sample (Example 2 sample) for the magnetoresistive device was prepared.

Using the magnetoresistive of the thus formed Example 2 sample, a signal magnetic field was detected from a medium corresponding to −400 Oe to 400 Oe. As a result, it has been confirmed that viable magnetic resistance changes are obtainable. Further, a stress magnetic field of 500 Oe was applied to the sample of Example 2 for the magnetoresistive device to measure output fluctuations before and after the application of the stress magnetic field. It has thus been found that the incidence of defective devices is very low, and the magnetoresistive device of the sample of Example 2 is strikingly improved in terms of magnetic field resistance.

Experimental Example 3

In the Example 1 sample of the aforesaid Experimental Example 1, the multilayer construction of the first 300, and the second exchange coupling gap layer 500 was changed as set out in Table 2 given below to prepare an experimental sample (Example 3 sample) of the magnetoresistive device as embodied in FIG. 12.

In the construction enumerated in Table 2, the magnetization 31b of the front frame-constituting portion 31 for the first shield layer 3 is antiferromagnetically coupled to the magnetization 111a of the gap adjustment layer 111, the magnetization 111a of the gap adjustment layer 111 is antiferromagnetically coupled to the magnetization 112b of the gap adjustment layer 112, and the magnetization 112b of the gap adjustment layer 112 is antiferromagnetically coupled to the magnetization 135 of the first ferromagnetic layer 130, as shown in FIG. 12. Likewise, the magnetization 51a of the front frame-constituting portion 51 for the second shield layer 5 is antiferromagnetically coupled to the magnetization 115b of the gap adjustment layer 115, the magnetization 115b of the gap adjustment layer 115 is antiferromagnetically coupled to the magnetization 116a of the gap adjustment layer 116, and the magnetization 116a of the gap adjustment layer 116 is antiferromagnetically coupled to the magnetization 151 of the second ferromagnetic layer 150.

In this Example 3 sample, (1) two ferromagnetic layers, say, the gap adjustment layers 111 and 112 have the matching quantity of magnetization Mst and are strongly antiferromagnetically coupled to each other, and (2) two ferromagnetic layers, say, the gap adjustment layers 115 and 116 have the matching quantity of magnetization Mst and are strongly antiferromagnetically coupled to each other.

Using the magnetoresistive of the thus formed Example 3 sample, a signal magnetic field was detected from a medium corresponding to −400 Oe to 400 Oe. As a result, it has been confirmed that viable magnetic resistance changes are obtainable. Further, a stress magnetic field of 500 Oe was applied to the sample of Example 3 for the magnetoresistive device to measure output fluctuations before and after the application of the stress magnetic field. It has thus been found that the incidence of defective devices is very low, and the magnetoresistive device of the sample of Example 3 is strikingly improved in terms of magnetic field resistance.

TABLE 2

| Multilayer Structure | | | Layer Material | Thickness (nm) |
|---|---|---|---|---|
| Front Frame-Constituting Portion (51) for the Second Shield Layer | | | NiFe | 1000 |
| Magnetoresistive Unit (8) | Second Exchange Coupling Gap Layer (500) | Exchange Coupling Transfer Layer (105) | Ru | 0.8 |
| | | Gap Adjustment Layer (115) | CoFe | 2.0 |
| | | Exchange Coupling Transfer Layer (106) | Ru | 0.8 |
| | | Gap Adjustment Layer (116) | CoFe | 2.0 |
| | | Exchange Coupling Adjustment | Cu | 0.9 |

TABLE 2-continued

| Multilayer Structure | | Layer Material | Thickness (nm) |
|---|---|---|---|
| Sensor Area | Layer (125) Second Ferromagnetic Layer (150) | CoFe | 3.0 |
| | Nonmagnetic Intermediate Layer (140) | Cu ZnO Cu | 0.5 1.8 0.5 |
| | First Ferro-Magnetic Layer (130) | CoFe | 3.0 |
| First Exchange Coupling Gap Layer (300) | Exchange Coupling Transfer Layer (121) | Cu | 0.9 |
| | Gap Adjustment Layer (112) | CoFe | 2.0 |
| | Exchange Coupling Transfer Layer (102) | Ru | 0.8 |
| | Gas Adjustment Layer (111) | CoFe | 2.0 |
| | Exchange Coupling Adjustment Layer (101) | Ru | 0.8 |
| Front Frame-Constituting Portion (31) for the First Shield Layer | | NiFe | 1000 |

From the aforesaid results, the advantages of the invention would be undisputed.

That is, the present invention provides a magnetoresistive device with the CPP (current perpendicular to plane) structure, comprising a magnetoresistive unit, and a first shield layer and a second shield layer located and formed such that the magnetoresistive unit is sandwiched between them, with a sense current applied in a stacking direction, wherein said magnetoresistive unit comprises a nonmagnetic intermediate layer, and a first ferromagnetic layer and a second ferromagnetic layer stacked and formed such that said nonmagnetic intermediate layer is interposed between them, wherein said first shield layer, and said second shield layer is controlled by magnetization direction control means in terms of magnetization direction, and said first ferromagnetic layer, and said second ferromagnetic layer receives action such that there is an antiparallel magnetization state created, in which mutual magnetizations are in opposite directions, under the influences of magnetic actions of said first shield layer and said second shield layer. It is thus possible to achieve an antiparallel magnetization state for two ferromagnetic layers (free layers) with simple structure yet without being restricted by the material and specific structure of an intermediate film interposed between the two ferromagnetic layers (free layers). Further, it is possible to make improvements in linear recording densities by the adoption of a structure capable of making the "read gap length" (the gap between the upper and lower shield layers) short (narrow) thereby meeting recent demands for ultra-high recording densities. Furthermore, it is possible to obtain stable magnetoresistive changes so that much higher reliability is achievable.

INDUSTRIAL APPLICABILITY

The present invention could be applied to the industry of magnetic disk systems comprising a magnetoresistive device operable to read the magnetic field intensity of magnetic recording media or the like as signals.

We claim:

1. A magnetoresistive device with a CPP (current perpendicular to plane) structure, comprising a magnetoresistive unit, and a first, substantially soft magnetic shield layer positioned below and a second, substantially soft magnetic shield layer positioned above, which are located and formed such that the magnetoresistive unit is sandwiched between them, with a sense current applied in a stacking direction, characterized in that:

said magnetoresistive unit comprises a non-magnetic intermediate layer, and a first ferromagnetic layer and a second ferromagnetic layer stacked and formed such that said nonmagnetic intermediate layer is interposed between them, each of said first shield layer positioned below and said second shield layer positioned above is configured in a frame shape having a planar shape (X-Y plane) defined by the width and length directions of the device, wherein the framework for said first, and said second shield layer has a front frame-constituting portion located on a medium opposite plane side in front and near where the magnetoresistive unit is positioned, and each of the first ferromagnetic layer and second ferromagnetic layer forming said magnetoresistive unit receives action such that, under influences of magnetic action of the front frame-constituting portions for said first and second shield layers, there is an antiparallel magnetization state created, in which mutual magnetizations are in opposite directions.

2. The magnetoresistive device according to claim 1, wherein each of the frameworks for said first and second shield layers comprises a front frame-constituting portion located on the medium opposite plane side in front and near where the magnetoresistive unit is positioned and a side frame-constituting portion located at a side position extending from the end of said front frame-constituting portion in a rear direction, the width $Y_1$ of the side frame-constituting portion for said first shield layer is larger than the depth length $Y_2$ of the front frame-constituting portion for said first shield layer ($Y_1 > Y_2$), the width $Y_3$ of the side frame-constituting portion for said second shield layer is larger than the depth length $Y_4$ of the front frame-constituting portion for said second shield layer ($Y_3 > Y_4$), the side frame-constituting portion for said first shield layer partially comprises a combination of a first nonmagnetic gap layer with a first bias magnetic field-applying layer wherein said first nonmagnetic gap layer is designed and located in such a way as to efficiently send a magnetic flux given out of said first bias magnetic field-applying layer out to the front frame-constituting portion for said first shield layer, and the combination of said first nonmagnetic gap layer with said first bias magnetic field-applying layer forms a closed magnetic path with a magnetic flux going all the way around the frame shape forming said first shield layer and turns into a single domain the magnetization of the front frame-constituting portion for said first shield layer and control the direction of that magnetization, and the side frame-constituting portion for said second shield layer partially comprises a combination of a second nonmagnetic gap layer with a second bias magnetic field-applying layer wherein said second nonmagnetic gap layer is designed and located in such a way as to efficiently send a magnetic flux given out of said second bias magnetic field-applying layer out to the front frame-constituting portion for said second shield layer, and the combination of said second nonmagnetic gap layer with said second bias magnetic field-applying layer forms a closed magnetic path with a magnetic flux going all the way around the frame shape forming said second shield layer and turns into a single domain the magnetization of the front frame-constituting portion for said second shield layer and controls the direction of that magnetization.

3. The magnetoresistive device according to claim 2, wherein said first ferromagnetic layer forming a part of said magnetoresistive unit is indirectly magnetically coupled to the front frame-constituting portion for said first shield layer having a controlled direction of magnetization by way of a first exchange coupling function gap layer, and said second ferromagnetic layer forming a part of said magnetoresistive unit is indirectly magnetically coupled to the front frame-constituting portion for said second shield layer having a controlled direction of magnetization by way of a second exchange coupling function gap layer.

4. The magnetoresistive device according to claim 3, wherein said first exchange coupling function gap layer comprises, in order from said first shield layer side, an exchange coupling transfer layer, a gap adjustment layer and an exchange coupling adjustment layer, and said second exchange coupling function gap layer comprises, in order from said second shield layer side, an exchange coupling transfer layer, a gap adjustment layer and an exchange coupling adjustment layer.

5. The magnetoresistive device according to claim 4, wherein said exchange coupling transfer layer is made up of at least one material selected from the group consisting of Ru, Rh, Ir, Cr, Cu, Ag, Au, Pt, and Pd, said gap adjustment layer is made up of a ferromagnetic material, and said exchange coupling adjustment layer is made up of at least one material selected from the group consisting of Ru, Rh, Ir, Cr, Cu, Ag, Au, Pt, and Pd.

6. The magnetoresistive device according to claim 3, wherein said first exchange coupling function gap layer comprises, in order from said first shield layer side, an exchange coupling transfer layer, a gap adjustment layer, an exchange coupling transfer layer, a gap adjustment layer, and an exchange coupling adjustment layer, and said second exchange coupling function gap layer comprises, in order from said second shield layer side, an exchange coupling transfer layer, a gap adjustment layer, an exchange coupling transfer layer, a gap adjustment layer, and an exchange coupling adjustment layer.

7. The magnetoresistive device according to claim 2, wherein in said first shield layer, $\Phi'b/\Phi'f(s)=0.3$ to $2.0$ where $\Phi'b$ is the total quantity of a magnetic flux flowing out of the first bias magnetic field-applying layer and $\Phi'f(s)$ is the saturation quantity of a magnetic flux for saturation magnetization of the front frame-constituting portion, and in said second shield layer, $\Phi b/\Phi f(s)=0.3$ to $2.0$ where $\Phi b$ is the total quantity of a magnetic flux flowing out of the second bias magnetic field-applying layer and $\Phi f(s)$ is the saturation quantity of a magnetic flux for saturation of magnetization of the front frame-constituting portion.

8. The magnetoresistive device according to claim 2, wherein the width $Y_1$ of the side frame-constituting portion for said first shield layer is 1.4 to 10 times as large as the depth length $Y_2$ of the front frame-constituting portion for said first shield layer, and the width $Y_3$ of the side frame-constituting portion for said second shield layer is 1.4 to 10 times as large as the depth length $Y_4$ of the front frame-constituting portion for said second shield layer.

9. The magnetoresistive device according to claim 2, wherein said first nonmagnetic gap layer is buried in the side frame-constituting portion for said first shield layer and the first bias magnetic field-applying layer is formed adjacent to said first nonmagnetic gap layer, and said second nonmagnetic gap layer is buried in the side frame-constituting portion for said second shield layer and the second bias magnetic field-applying layer is formed adjacent to said second nonmagnetic gap layer.

10. The magnetoresistive device according to claim 2, wherein said first and second shield layers each have a thickness of 0.5 to 2.0 μm, and said first and second bias magnetic field-applying layers each have a thickness of 0.1 to 0.3 μm.

11. The magnetoresistive device according to claim 1, wherein said nonmagnetic intermediate layer is made up of a triple-layer structure with ZnO located at the center thereof.

12. The magnetoresistive device according to claim 1, wherein in the length direction (Y-direction) of the depth side of said magnetoresistive unit there is a device bias magnetic field-applying layer formed to define a magnetization direction angle as an initial state with the first and second ferromagnetic layers functioning as free layers.

13. The magnetoresistive device according to claim 12, wherein said bias magnetic field-applying layers and device bias magnetic field-applying layer are magnetized simultaneously and integrally in a length direction (Y-direction).

14. The magnetoresistive device according to claim 1, wherein each of the frameworks for said first and second shield layers comprises a front frame-constituting portion located on the medium opposite plane side and near where the magnetoresistive unit is positioned, and a coil is wound around a part of each of the frameworks for said first and second shield layers, so that by a magnetic flux generated by passing a current through said coil, the front frame-constituting portion for each of said first and second shield layers is turned into a single domain and the direction of magnetization is controlled.

15. A thin-film magnetic head, characterized by comprising:
a plane in opposition to a recording medium, and
a magnetoresistive as recited in claim 1, which is located near said medium opposite plane to detect a signal magnetic field from said recording medium.

16. A head gimbal assembly, characterized by comprising:
a slider including a thin-film magnetic head as recited in claim 15 and located in such a way as to oppose to a recording medium, and
a suspension adapted to resiliently support said slider.

17. A magnetic disk system, characterized by comprising:
a slider including a thin-film magnetic head as recited in claim 15 and located in such a way as to oppose to a recording medium, and
a positioning device adapted to support and position said slider with respect to said recording medium.

* * * * *